United States Patent [19]

Ikeda et al.

[11] 4,115,127
[45] Sep. 19, 1978

[54] PROCESSING-FREE TYPE LITHOGRAPHIC PRINTING PLATE MATERIAL

[75] Inventors: Tomoaki Ikeda; Yuzo Mizobuchi; Akira Nahara; Yasuo Washizawa; Yoshihiro Ono; Takeshi Tomotsu, all of Asaka, Japan

[73] Assignee: Fuji Photo Film Co., Ltd., Minami-ashigara, Japan

[21] Appl. No.: 776,699

[22] Filed: Mar. 11, 1977

Related U.S. Application Data

[63] Continuation of Ser. No. 562,385, Mar. 26, 1975, abandoned.

[30] Foreign Application Priority Data

Mar. 26, 1974 [JP] Japan .................................. 49-33790

[51] Int. Cl.$^2$ .......................... G03C 1/86; G03C 1/78; G03F 7/02; G03C 5/00
[52] U.S. Cl. ............................................. 96/85; 96/33; 96/36; 96/67; 96/86 R; 96/87 R; 101/456; 101/458; 101/453
[58] Field of Search ............... 96/33, 36, 67, 85, 86 R, 96/87 R; 101/453, 456, 458

[56] References Cited

U.S. PATENT DOCUMENTS

| | | | |
|---|---|---|---|
| 3,650,743 | 3/1972 | Hallman et al. ......................... 96/33 |
| 3,678,852 | 7/1972 | Feinleib et al. .................... 96/33 UX |
| 3,707,372 | 12/1972 | Hallman et al. ...................... 96/33 X |
| 3,762,325 | 10/1973 | Hallman et al. ...................... 101/453 |

Primary Examiner—Edward C. Kimlin
Attorney, Agent, or Firm—Sughrue, Rothwell, Mion, Zinn and Macpeak

[57] ABSTRACT

A processing-free lithographic printing plate, which comprises a support having deposited thereon a composition containing germanium and sulfur and at least one of a metal or metal compound in a physically mixed state.

18 Claims, No Drawings

PROCESSING-FREE TYPE LITHOGRAPHIC PRINTING PLATE MATERIAL

This is a continuation of application Ser. No. 562,385, filed Mar. 26, 1975, now abandoned.

BACKGROUND OF THE INVENTION

1. Field of the Invention

The present invention relates to a processing-free type lithographic printing plate material and, more particularly, to a processing-free type lithographic printing plate material which can be mounted, after exposure, on a printing press without any processing to conduct printing. In this specification, both the material for preparing a lithographic printing plate and the lithographic printing press plate prepared from the material are called "lithographic printing plate," for simplicity and as is common in the art.

2. Description of the Prior Art

Heretofore, as lithographic printing plates, those which are called deep-etch plates and PS (presensitized) plates have enjoyed the most popularlity. Deep-etch plates are obtained by coating a negative type light-sensitive resin on a grained Al or Zn plate and printing thereon a positive original. After development-processing, the plate is etched or a tincture applied thereto without etching, and then, after applying thereto a lacquer, removing the light-sensitive resin layer hardened by exposure. On the other hand, PS plates have a constitution in which a light-sensitive resin is coated mainly on an aluminum plate. Press plates can be prepared therefrom by printing thereon a positive or negative original and, after development processing, applying a developing ink or a protective lacquer to the hardened light-sensitive resin layer constituting image areas. As is described above, PS plates have the advantage in that several processing steps can be omitted in obtaining press plates as compared with deep-etch plates. However, a developing step and the like are still required.

Processing-free type lithographic printing plates have been suggested which enable the processing steps of lithographic printing plates after exposure to be omitted and printing to be conducted by directly mounting the exposed plates on a printing press without any chemical processings. In this specification, the term "processing-free" is used in the above-described sense. U.S. Pat. No. 3,650,743 describes this type of lithographic plates in detail. According to the disclosure, the process for preparing a lithographic printing plate involves using an electromagnetic radiation-respondent member having a three-layered structure (each layer being intimately adhered to each other) comprising a metallic first layer, a second layer of a material capable of reacting, upon being exposed, with the first layer to form a mutual reaction product, and a third layer of a material which does not react with the second layer. The process comprises exposing the second layer to an image using electromagnetic radiation through the first or third layer to thereby selectively form the mutual reaction product, thus imparting to the areas where the reaction product is formed a hydrophilicity-to-oleophilicity relationship different from that at the remaining unreacted areas.

In this process, the light-sensitive layer of the light-sensitive material to be used has a two-layered structure comprising a first layer and a second layer, as disclosed above, and extremely toxic materials such as arsenic trisulfide, arsenic pentasulfide, etc., are used as a light-sensitive element. Therefore, this lithographic printing plate can not be said to be desirable due to the toxicity of the materials used and the multi-layered structure.

SUMMARY OF THE INVENTION

As a result of extensive investigations on processing-free type lithographic printing plates, a processing-free type lithographic printing plate which is different from the above-described conventional lithographic printing plates, which solves various problems encountered with conventional lithographic printing plates, and which possesses excellent properties as compared with processing-free type lithographic plate using an arsenic-containing compound has been developed.

That is, the present invention provides a processing-free type lithographic printing plate (material) which comprises a base plate having deposited thereon a composition containing germanium and sulfur and at least one of a metal or a metal compound in a physically mixed state.

DETAILED DESCRIPTION OF THE INVENTION

In comparison with the lithographic printing plate described in U.S. Pat. No. 3,650,743, the processing-free type lithographic printing plate of the present invention is greatly different therefrom in the following various aspects. That is, although both this invention and the disclosure of U.S. Pat. No. 3,650,743 relate to processing-free type lithographic printing plates, that of the United States Patent uses a three-layered, radiation-respondent member as described above, whereas, in that of the present invention, the respective components of the light-sensitive layer are deposited onto a base plate in a physically mixed state and not in a multi-layered state. Also, as to the components of the light-sensitive layer, that of the United States Patent uses a metal and arsenic trisulfide or arsenic pentasulfide, while the present invention uses a metal and a composition containing germanium and sulfur. Furthermore, with the United States Patent plate, the light sensitivity desired to prepare a radiation-respondent member is obtained by bringing a metal into contact with arsenic trisulfide or arsenic pentasulfide, while, in the present invention, the germanium- and sulfur-containing composition itself is light-sensitive and a metal is used to improve printability additionally. Thus, each component exhibits an absolutely different function in both plates.

These differences will become clearer from the detailed description of the present invention to be given hereinafter. In particular, it is to be emphasized that, as compared with arsenic trisulfide or arsenic pentasulfide used in the United States Patent, the composition containing germanium and sulfur of this invention is much superior in the prevention of toxic pollution and exhibits quite excellent physical and chemical properties. In particular, it is greatly significant in the completion of the present invention that the composition containing germanium and sulfur has a greater hydrophilicity.

The present invention is described in detail below.

First, the base plate to be used in the present invention is a base plate having a hydrophilic surface and a suitable rigidity, and includes all of those plates which have been used as base plates for conventional lithographic printing plates or which have the possibility to be used as a base plate. For example, a metal plate, a synthetic resin sheet whose surface has been rendered hydrophilic, a laminate of a metal plate or metal foil and a synthetic resin sheet or paper and the like can be used as a base plate.

An Al plate and a Zn plate are usually used as a metal plate. However, the so-called multi-layer plates which include a bimetal plate comprising an aluminum plate having a copper or chromium layer or comprising a copper plate having a chromium layer, a trimetal plate comprising a steel plate having a copper layer and a chromium layer, an aluminum clad plate comprising an aluminum alloy plate having a pure aluminum layer, a laminate of a plastic sheet or paper and an aluminum foil and the like, can also be used. In the case of using these metal plates, graining is preferably employed so as to improve water-retaining properties and the intimate adhesion between the metal plate and the composition containing germanium and sulfur. Chemical or electrical treatment of the grained surface, if necessary, has also been conducted with conventional PS plates, and the like. In particular, with Al plates, such a treatment has generally been conducted to form an alumite layer on the grained surface through anodic oxidation as disclosed in U.S. Pat. Nos. 2,115,339, 2,119,031, 3,280,734, and 3,511,661. Further, it is possible to further improve the adaptability as a lithographic printing plate by processing the surface with a suitable acid or alkali. Sulfuric acid, phosphoric acid, oxalic acid, and the like can be used as the electrolytic solution for conducting the anodic oxidation of the Al plate. Treatments such as graining an Al plate and laying a porous chromium plating on the surface thereof can also be conducted. The thus-prepared base plates can also be utilized.

Examples of synthetic resin sheets whose surface has been rendered hydrophilic are a cellulose triacetate sheet whose surface has been saponified to render the surface hydrophilic, and a synthetic resin sheet such as a sheet of polyethylene terephthalate, polyvinyl chloride, polycarbonate, polystyrene or polypropylene having a hydrophilic layer coated on the surface thereof.

In utilizing a metallic surface, it is not necessary to use a completely metallic base plate, and it is possible to partly replace the mechanical strength of the plate with suitable synthetic resins or paper. It is possible to utilize a composite sheet prepared by laminating a metallic layer and a synthetic resin sheet or paper.

A composition containing germanium and sulfur, which is one of the most characteristic aspects of the present invention, is obtained using as the starting materials, germanium, sulfur and, if desired, other elements or compounds in a predetermined atomic ratio, sealing them in a quartz vessel under a reduced pressure of about $10^{-2}$ to $10^{-7}$ Torr, heat-melting at the temperature of about 500° to about 1,300° C., and stirring for a long period of time to make the melt uniform, then quenching the melt by immersion into water or taking out the melt into air at the cooling rate of about 0.1 to about 100° C./sec. Needless to say, not only simple substances of germanium and sulfur but also germanium sulfide which is a compound of both of the elemental substances can be used.

Therefore, the Ge-S composition of the present invention can be devided into the main three classes of Ge-S, Ge-S-X and Ge-S-X-Y and the ratio of Ge and S components in the composition is within $1 \leq S/Ge < 16$, preferably $1 \leq S/Ge < 9$. The components of X and Y is effective in controlling the reactivity against the metal layer, the chemical and thermal stability and the physical strength and the hydrophilic and oleophilic properties of a physically mixed layer of the composition. The specific examples of the components X and Y include metallic elements such as Al, Mg, Ti, V, Mn, Co, Ni, Mo, W, Sn, Zn, Pb, Ag, Pd, In, K, As or the like, semi-metallic elements such as Sb, Si, Bi, Se, Te or the like and non-metallic elements such as O, P, I or the like. These components are selected as non- or less toxic components in view of the production of printing plates without causing any pollutions.

Specific examples of compositions containing germanium and sulfur usable in the present invention are illustrated below.

Ge-S System $GeS$, $GeS_{15}$, $Ge_{35}S_{65}$, $GeS_2$, $GeS_4$, $Ge_{15}S_{85}$ Ge-S-X System $Ge_{35}S_{60}Al_5$ (amorphous substance), $Ge_{35}S_{60}P_5$ (crystalline substance), $Ge_{35}S_{60}Sb_5$ (amorphous substance), $Ge_{35}S_{60}Si_5$ (amorphous), $Ge_{35}S_{60}Mg_5$ (amorphous substance + crystalline), $Ge_{35}S_{60}Ti_5$ (amorphous substance + $GeS_2$ + $TiS_2$), $Ge_{35}S_{60}V_5$ (amorphous substance + $GeS_2$ + $V_2S_3$), $Ge_{35}S_{60}Mn_5$ (amorphous substance + $Mn_2GeS_4$), $Ge_{35}S_{60}Co_5$ (amorphous substance + $GeS_2$), $Ge_{35}S_{60}Ni_5$ (amorphous substance + $GeS_2$), $Ge_{35}S_{60}Ta_5$ (amorphous substance + $TaS_2$), $Ge_{35}S_{60}Mo_5$ (amorphous substance + $MoS_2$), $Ge_{35}S_{60}W_5$ (amorphous substance + $WS_2$ + crystalline), $Ge_{35}S_{60}Sn_5$ (amorphous substance + $\beta$-$SnS_2$ or $\alpha$-$Sn_1$ + $xS_2$), $Ge_{35}S_{60}Zn_5$ (amorphous substance + $ZnS$), $Ge_{35}S_{60}Pb_5$ (amorphous substance + $GeS_2$), $Ge_{25}S_{70}Bi_5$ (amorphous substance), $Ge_{20}S_{70}Bi_{10}$ (amorphous substance), $Ge_{10}S_{70}Bi_{20}$ (amorphous substance), $Ge_{20}S_{80}Bi_{10}$ (amorphous substance), $Ge_{40}S_{60}Bi_1$ (amorphous substance), $Ge_5S_{80}Bi_{15}$ (amorphous substance), $Ge_{35}S_{60}Bi_{10}$ (amorphous substance + Bi), $Ge_{35}S_{60}Bi_{15}$ (amorphous substance + Bi), $Ge_{40}S_{6.0}Bi_5$ (amorphous substance + Bi), $Ge_{40}S_{60}Bi_{10}$ (amorphous substance + Bi), $Ge_{35}S_{60}Bi_2$ (amorphous substance + Bi), $Ge_{38.46}S_{61.54}Bi_5$ (amorphous substance + Bi), $Ge_{37.74}S_{62.26}Bi_5$ (amorphous substance + Bi), $Ge_{31.3}S_{68.7}Bi_5$ (amorphous substance + $GeS_2$), $Ge_{20}S_{6.0}Bi_{20}$ (amorphous substance + $GeS_2$), $Ge_{10}S_{60}Bi_{30}$ (amorphous substance + $Bi_2S_3$), $Ge_{40}S_{60}Bi_{15}$ (amorphous substance + Bi + $GeS_2$), $Ge_{10}S_{50}Bi_{40}$ (amorphous substance + Bi + $Bi_2S_3$), $Ge_{35}S_{60}Bi_5$ (amorphous substance + Bi + $GeS_2$ + GeS), $Ge_{35}S_{65}Bi_5$ (amorphous substance + Bi + $GeS_2$ + GeS), $Ge_{33.3}S_{66.7}Bi_{15}$ (amorphous substance + Bi + $GeS_2$ + GeS), $Ge_{20}S_{50}Bi_{30}$ (amorphous substance + Bi + $GeS_2$ + $Bi_2S_3$), $Ge_{45}S_{50}Bi_5$ (GeS + Bi), $Ge_{20}S_{80}O_{0.2}$, $Ge_{20}S_{80}O_{20}$, $Ge_{42}S_{58}Ag_{0.1}$, $Ge_{42}S_{58}Ag_2$, $Ge_{36}S_{55}I_9$, $Ge_{35}S_{60}Al_{15}$, $Ge_{20}S_{75}Al_5$, $Ge_{30}S_{60}P_{10}$, $Ge_{30}S_{60}Sb_{10}$, $Ge_{25}S_{50}Sb_{25}$ Ge-S-X-Y System $Ge_{25}Si_{10}S_{60}Bi_5$ (amorphous substance + Bi), $Ge_{30}Si_5S_{60}Bi_5$ (amorphous substance + Bi + $GeS_2$), $Ge_{20}Si_{15}S_{60}Bi_5$ (amorphous substance + Bi + $SiS_2$), $Ge_{15}Si_{20}S_{60}Bi_5$ (amorphous substance + Bi + $SiS_2$), $Ge_{10}Si_{25}S_{60}Bi_5$ (amorphous substance + Bi + $SiS_2$ + $Bi_2S_3$ + $GeS_2$), $Ge_{33}S_{57}Bi_5Ag_5$ (amorphous substance + Bi), $Ge_{30}S_{60}Bi_5Ag_5$ (amorphous substance + Bi + $GeS_2$ + GeS), $Ge_{34}S_{59}Bi_5Ag_2$ (amorphous substance + Bi + $GeS_2$ + GeS), $Ge_{33}S_{57}Bi_5O_5$ (amorphous substance + Bi), $Ge_{20}S_{80}P_{10}O_2$, $Ge_{20}S_{80}P_{10}O_{20}$, $Ge_{20}S_{60}Sb_5P_5$, $Ge_{15}S_{70}Sb_{7.5}P_{7.5}$, $Ge_{10}S_{80}P_{10}Pb_{0.5}$, $Ge_{10}S_{80}P_{10}Pd_5$, $Ge_{10}S_{80}P_{10}Bi_{10}$, $Ge_{35}S_{60}P_5Bi_5$, $Ge_{35}S_{60}Bi_5I_5$ In the above-described examples, the subscript numerals represent the composition ratios in terms of the atomic ratios of the starting materials. Some of them are not normalized, and hence the sum of the subscript numerals sometimes exceeds 100. Compositions containing oxygen are prepared by melting as the oxides. The parenthetical descriptions qualitatively represent the results obtained by X-ray analysis of the compositions. All of them are not amorphous solids called chalcogenide glasses, but some compositions contain crystalline substances. The lithographic printing plate of the present invention can also be obtained using such compositions.

Lithographic printing plates prepared by vacuum-evaporating the composition containing germanium and sulfur, for example, on a grained Al plate provides, when exposed and provided with damping water, a negative or positive image, to which a protective ink is applied. For example, $GeS_{1.5}$, $GeS_2$, $GeS_4$, $GeS_{5.67}$, $Ge_{35}S_{60}Bi_5$, $Ge_{42}S_{58}Ag_2$, etc., provide positive type images, whereas $Ge_{15}S_{70}S_{67.5}P_{7.5}$, $Ge_{30}S_{60}Sb_5P_5$, etc., provide negative type images. However, since the compositions containing Ge and S become more hydrophilic upon being irradiated with light, many of them provide positive type images. Also, the composition becomes more oleophilic as the amount of sulfur in the composition increases.

Images obtained using a single layer of the composition containing germanium and sulfur are a slightly indistinct and, when printing is conducted using them, the durability thereof is so low that they are not so practical. As a result of various experiments and investigations to remove this defect, it has been found that a processing-free type lithographic printing plate having an extremely excellent resolving power and a practical durability can be obtained using at least one metal and/or one metal compound in a physically mixed state in the composition. This will be described in detail below.

(1) Use of a Metal in a Physically Mixed State in the Composition

Metal was vacuum-evaporated onto a grained Al plate in an average amount of 0.085 to 4.0 $\mu g/cm^2$, followed by vacuum-evaporating thereon $Ge_{35}S_{60}Bi_5$ in an average amount of 2.0 to 2.5 $\mu g/cm^2$. When the characteristics of the resulting samples were examined, they all showed positive type light-sensitive characteristics. That is, an oily ink adhered to the unexposed areas to form image areas, whereas the exposed areas became hydrophilic and formed non-image areas where ink did not adhere. The degrees of hydrophilicity and oleophilicity vary considerably depending upon the kind of metal employed. Examples of metals capable of increasing the oleophilicity as compared with the case of depositing $Ge_{35}S_{60}Bi_5$ alone are copper, silver, gold, aluminium, gallium, indium, tin, vanadium, selenium, chromium, iron, magnesium, germanium, bismuth, manganese, cobalt, nickel, thallium, antimony, lead, tellurium, or palladium. Of these, Cu, Ag, Al, In, Sn and Cr increase the oleophilicity to a great extent, Au, Ga, Ge, V and Fe increase the oleophilicity considerably and Se increases the oleophilicity slightly. On the other hand, examples of metals capable of increasing the hydrophilicity as compared with the case of using $Ge_{35}S_{60}Bi_5$ alone are Mg, Bi, Mn, Co and Ni. Of these, Mn, Co and Ni increases the hydrophilicity to a great extent and Mg and Bi increase the hydrophilicity slightly. Also, examples of metals which produce almost no difference in hydrophilicity and oleophilicity as compared with the case of using $Ge_{35}S_{60}Bi_5$ alone are Cd, Tl, Sb, Te and Pd. Furthermore, good results were obtained with Cu, Al, Au and Sn when the composition containing germanium and sulfur was vacuum-evaporated onto a grained Al plate and these metals were vacuum-evaporated thereon, followed by conducting printing.

Good results were obtained with samples prepared by vacuum-evaporating $Ge_{35}S_{60}Bi_5$ onto a grained Al plate in an amount of 2.4 $\mu g/cm^2$ and then vacuum-evaporating Cu in a deposited amount of 1.0 $\mu g/cm^2$.

Good results were obtained with samples prepared by vacuum-evaporating $Ge_{35}S_{60}P_5$ onto a grained Al plate in a deposited amount of 2.4 $\mu g/cm^2$ and vacuum-evaporating aluminum in an amount of 0.14 $\mu g/cm^2$ or vacuum-evaporating Sn in a deposited amount of 0.18 $\mu g/cm^2$.

From these results, it is demonstrated that similar results can be obtained either by first vacuum-evaporating a metal or by vacuum-evaporating a metal after vacuum-evaporating the composition containing germanium and sulfur. This is an extremely interesting fact and is one aspect of the present invention, which is one proof of the fact that the metal and the composition are present in a physically mixed state.

With some metals, the degree of hydrophilicity or oleophilicity varies also depending upon the amount deposited by vacuum evaporation. For example, with Ag, the hydrophilicity is increased when the deposited amount is 2 $\mu g/cm^2$ as compared with the case when the Ag is vacuum-evaporated in a deposited amount of 0.5 $\mu g/cm^2$. Also, with Cd and Sb, an increase in the deposition amount leads to an increase in the oleophilicity. That is, it is clear from the above-described results that, when one metal is present in a physically mixed state in the composition containing germanium and sulfur, the hydrophilic or oleophilic surface characteristic varies depending upon the kind and the vacuum-evaporated amount of the metal. From these results, it is possible to optionally adjust the surface characteristics by vacuum-evaporating two or more metals in a suitable amount to allow both metals to be present in a physically mixed state. Thus, the scope of the compositions containing germanium and sulfur usable as a lithographic printing plate can be expanded, which is extremely effective.

(2) Use of a Metal Compound in a Physically Mixed State in the Composition

Metal compounds which can be used are metal halides such as $PbI_2$, $CuCl$, $CuI$, $TeCl_4$, $HgI$ and $AgI$, metal sulfides such as $Ag_2S$, $PbS$, $SnS$, $BiS$, $FeS$, $Fe_2S_3$, $CdS$ and $ZnS$, and metal oxides such as $V_2O_5$, $MoO_3$, $Ge_2O_3$, $Bi_2O_3$, $TiO_2$, $PbO$ and $TeO_2$.

In the same manner as with metals, the metal compound was vacuum-evaporated on a grained Al plate in an average deposited amount of 0.15 to 0.45 $\mu g/cm^2$ and $Ge_{35}S_{60}Bi_5$ was vacuum-evaporated in an average deposited amount of 1.8 $\mu g/cm^2$ to examine the characteristics. Almost all of the thus-obtained light-sensitive surfaces comprising $Ge_{35}S_{60}Bi_5$ and metal compounds exhibited positive type light-sensitive characteristics. As with the case of using metals, the degree of hydrophilicity or oleophilicity varies considerably depending upon the kind of the metal compound. Metal compounds capable of increasing the oleophilicity as compared with the case of using $Ge_{35}S_{60}Bi_5$ alone are $CuI$, $AgI$, $FeS$ and $TeO_2$ and metal compounds capable of increasing the oleophilicity or causing almost no change as compared with the case of using $Ge_{35}S_{60}Bi_5$ alone are $CuCl$, $TeCl_4$, $Ag_2S$, $PbS$, $CdS$, $ZnS$, $V_2O_5$, $Ge_2O_3$, $BiO_3$, $PbO$, etc. Also, metal compounds capable of increasing the hydrophilicity as compared with the case of using $Ge_{35}S_{60}Bi_5$ alone are $PbI_2$, $BiS$, $MoO_3$, $TiO_2$, etc. Although it is not certain in vacuum-evaporating these metal compounds whether the vacuum-evaporated product has the same composition as the starting material or not, a vacuum evaporation monitor definitely shows that some substance is vacuum-evaporated, and the property which the vacuum-evaporated surface has is sufficiently reproducible when vacuum evaporation is conducted under the same conditions.

Additionally, it has also been experimentally determined that, when $SnS$ and $Fe_2S_3$ are vacuum-evaporated, the light-sensitive characteristic changes from a positive type to a negative type as the exposure time is prolonged. The reason for this phenomenon is not completely clear.

As is clear from the above-described results, when one metal compound is present in a physically mixed state in the composition containing germanium and sulfur, the hydrophilic or oleophilic surface characteristic can be changed by selecting the kind of metal compound employed. Therefore, it is possible to optionally adjust the surface characteristics by vacuum-evaporating two or more metal compounds in a suitable amount so that they are present in a physically mixed state. Thus, the scope of the compositions containing germanium and sulfur usable as a lithographic printing plate can be expanded in the same manner as with metals, which is also extremely effective. Needless to say, it is also possible to optionally adjust the surface characteristics by vacuum-evaporating a single metal compound in a suitable amount. Thus, the present invention is quite effective in the control of the surface characteristics which it provides.

As has already been described, an extremely excellent resolving power and a sufficiently practical durability can be obtained and the surface characteristics can be adjusted as desired using the composition containing germanium and sulfur in a physically mixed state with at least one metal and/or one metal compound, which are extremely important in the practice of the present invention.

As has already been also described, in order to obtain the processing-free type lithographic printing plate of the present invention, (1) a composition containing germanium and sulfur and (2) at least one of a metal and a metal compound are deposited onto the above-described base plate in a physically mixed state. The term "physically mixed state" as used herein does not mean the state where both ingredients form complete films or layers on a base plate in a superposed disposition but rather means the microscopic condition in which there are areas where the surface of the base plate is uncovered, areas of the composition containing germanium and sulfur, areas of a metal or a metal compound, and areas where the composition containing germanium and sulfur and a metal or metal compound are superimposedly deposited, on the surface of the base plate. Therefore, the necessary condition for forming such a surface condition is to form on the base plate discontinuous areas of the composition containing germanium and sulfur and of a metal or a metal compound without forming completely continuous layers of the composition and a metal or a metal compound. When irregular unevenness exists on the base plate as with a grained Al plate, the surface condition appears to be more complicated. However, the reproducibility of the printing properties of surfaces obtained by forming a light-sensitive film under definite conditions has been confirmed. It is supposed that, within the scope of resolving power required in printing, a statisticly stable microscopic surface can be obtained.

Suitable processes for forming the physically mixed state include a process of using a certain kind of mask superimposed on a base plate. For example, a stainless steel mesh screen is superposed on a grained Al plate and a composition containing germanium and sulfur is vacuum-evaporated thereon not in a film state but in a discontinuous state. Then, a mesh screen is superposed thereon and a metal or a metal compound is vacuum-evaporated thereon. In this case, upon vacuum-evaporating a metal or a metal compound, a mesh screen is superposed in such a manner that not all of the metal or metal compound to be vacuum-evaporated is deposited on the above-described already vacuum-evaporated composition and that all of the metal or metal compound is not vacuum-evaporated only onto the surface of the base plate not covered by the above-described composition. In this case, the printing property of the surface changes, in some cases, depending upon the area of portions where the composition containing germanium and sulfur and the metal or metal compound are superposed over each other. Therefore, mesh screens having a different screen pitch of the screen mesh or a different size of the openings can be used for vacuum-evaporating the composition containing germanium and sulfur and vacuum-evaporating the metal or metal compound. Also, masks having regular openings such as a mesh screen need not necessarily be used, and masks having irregular openings such as a grained screen can also be used. However, in the case of depositing the composition containing germanium and sulfur and the metal or the metal compound in this manner, it is impossible to increase the resolving power higher than the screen pitch of the openings of the mask. Therefore, masks having quite small openings and pitches must be used. Thus, unavoidably some equipment limits do exist with respect to the resolving power attainable. However, these limits are due to the equipment presently available and not due to the invention per se.

It has become clear that, in the thus-prepared lithographic printing plates, there are, for example, areas of the grained surface of an Al plate, areas of the composition containing germanium and sulfur, areas of a metal or a metal compound and areas where a metal or a metal compound and the composition containing germanium and sulfur are superposed over each other, in a physically mixed state in certain area ratios based on the total surface area, and that the surface characteristics with respect to hydrophilicity and oleophilicity are different depending upon the ratios, from the case of each ingredient independently forming a single separate layer. In addition, with a grained surface, water-retaining properties or surface area is considerably increased as compared with a smooth surface, resulting in a complicated phenomenon. It is surmised that, by irradiating such a surface with light, the surface characteristics with respect to hydrophilicity and oleophilicity change at the irradiated areas and are different from that of the non-irradiated areas to form the images of the lithographic printing plate.

As is described above, in using masks, there are unavoidable equipment limits on resolving power. In order to increase the resolving power, each ingredient must be deposited in an isle-like pattern having a more minute pitch using some means of achieving such. As a result of experiments and investigations on this point, it has been discovered that a certain amount of the vacuum-evaporated substances corresponds to the formation of an isle-like pattern having an extremely minute pitch and that, when the composition containing germanium and sulfur and a metal or a metal compound are vacuum-evaporated in such amounts, a surface having extremely good printing properties can be obtained. The process of the formation of the vacuum-evaporated substances is so complicated that it is not yet completely understood. However, in recent years, vacuum-evaporated films have been extensively studied by means of an electron microscope. The process of the growth of vacuum-evaporated substances can be divided, in some cases, into (1) the step of the formation of nuclei and the development of the nuclei to particles, (2) the step of aggregation of the particles, and (3) the step of repetition of the aggregation to form a continuous film. For example, studies on the thickness of a vacuum-evaporated film of Au and the particle density thereof through observation of an electron microscopy have been reported, in which the description is that the particle density increases until the vacuum-evaporated amount becomes 0.6 $\mu g/cm^2$ and then the particle density decreases exponentially. This result can be interpreted as follows. That is, the formation of nuclei is predominant until the vacuum-evaporated amount becomes about 0.6 $\mu g/cm^2$, then aggregation becomes predominant. Also, the particle sizes are in a Gaussian distribution versus the vacuum-evaporated amount, with the particle size increasing as the vacuum-evaporated amount increases. Thus, the developing mechanism from formation of nuclei to the aggregation of particles can be understood. As one example of the particle size distribution, the maximum particle size in an Au thin film deposited in an amount of 1.0 $\mu g/cm^2$ is said to be 60 Å to 80 Å. Also, it is observed that, until the deposited amount becomes about 6 $\mu g/cm^2$, the particle size distribution is quite uniform, but the particle form becomes extremely irregular when the deposited amount becomes around 2.0 $\mu g/cm^2$ and particles of a long-sized form increase in number, the longitudinal size of such particles becoming 2,000 to 3,000 Å. When the electric resistance of a thin film of Ag, Cu, Al, etc., is measured, the resistance value sharply increase when the deposited amount becomes 32 to 34 $\mu g/cm^2$. From this, it appears that many bridges are formed in the isle-like deposits at the stage where the deposited amount slightly exceeds the above-described amount. It is extremely difficult to generally describe the relationship between the deposited amount and the isle-like form. In particular, a completely different structure may result depending upon the kind, form and temperature of the underlying substance, gases adsorbed on the underlying substance, the degree of vacuum upon vacuum evaporation, and the vacuum-evaporating rate. However, it appears that, when the deposited amount is 8 $\mu g/cm^2$ or less, the vacuum evaporation is in the stage before aggregation of the particles and, until the deposited amount becomes 32 to 34 $\mu g/cm^2$, it is in the stage of aggregation and, when the deposited amount becomes 80 $\mu/cm^2$ or higher, a continuous film is formed. However, this can be applied to a quite smooth surface and, with a surface having unevenness of not less than 1 $\mu$ such as a grained surface, the situation is considerably changed. However, as to the isle-like discontinuous film necessary in the present invention, it has become clear that a vacuum-evaporated film obtained by vacuum-evaporating in an amount even about 60 $\mu g/cm^2$ or less provides sufficient effectiveness, the resolving power thereof being improved.

In this specification, vacuum evaporation is mainly described as the process for depositing the above-described composition in a "physically mixed state." However, known processes for forming a thin film including a sputtering process, an ion-plating process, an electrodeposition process, an electrophoresis process, a gas phase precipitation process, a spraying process, and the like can be used as well as the vacuum-evaporating process. It is needless to say that the above-described embodiments of this invention can be obtained by employing any of these processes.

The sputtering process and the ion-plating process are analogous to the vacuum-evaporating process, and are effective for producing the lithographic printing plate of the present invention. For example, in order to deposit a metal or a metal compound, a direct current sputtering process is suitable, whereas an alternating current sputtering process is suitable in order to deposit the composition containing germanium and sulfur.

Additionally, a combination of the use of the above-described mask and a process such as vacuum evaporation can also provide good results.

Next, the printing characteristics of the resulting light-sensitive plate of this invention are described in detail taking, as an example, the depositing of (1) a composition containing germanium and sulfur and (2) at least one of a metal and a metal compound in a physically mixed state using a vacuum-evaporating process.

First, $GeS_{1.5}$ and Ag were used as the composition containing germanium and sulfur and as the metal, respectively. $GeS_{1.5}$ was deposited on a grained Al plate in an amount ranging from about 1 $\mu g/cm^2$ to about 12 $\mu g/cm^2$ and then Ag was deposited thereon in an amount ranging from about 0.2 $\mu g/cm^2$ to about 5 $\mu g/cm^2$ using a vacuum-evaporating process. Examination of the printing properties of the thus-obtained lithographic printing plate materials revealed the following fact. That is, as to the amount of Ag deposited on the base Al plate after first depositing $GeS_{1.5}$ thereon, absolutely no printing images or only extremely indistinct images were obtained when the amount of silver deposited exceeded about 2 $\mu g/cm^2$. Images with good quality were obtained when the amount of deposited silver was not more than about 2 $\mu g/cm^2$. In this case, printing images can be formed even when the amount of deposited $GeS_{1.5}$ was about 12 $\mu g/cm^2$. However, in order to form images with good quality, the amount of deposited $GeS_{1.5}$ had to be not more than 6 $\mu g/cm^2$. Further, when $GeS_{1.5}$ was deposited in a deposited amount of not more than about 1 $\mu g/cm^2$, images were formed by depositing Ag in an amount of about 1 $\mu g/cm^2$, but no images or images with an extremely poor quality were formed by depositing Ag in an amount of about 2 $\mu g/cm^2$. Also, when $GeS_{1.5}$ was deposited in an amount of about 1.5 $\mu g/cm^2$, images were formed by depositing Ag in an amount of about 1 $\mu g/cm^2$, but no images or images with extremely poor quality were formed by depositing Ag in an amount of about 2 $\mu g/cm^2$. Further, when $GeS_{1.5}$ was deposited in an amount of about 2.5 $\mu g/cm^2$, somewhat good images were obtained by depositing Ag in an amount of about 1 μg/cm², but the image quality was deteriorated when the amount of deposited Ag became about 2 μg/cm². In the case of depositing $GeS_{1.5}$ in an amount of not more than about 3 μg/cm², images with good image quality were obtained by depositing Ag in an amount of not more than about 1 μg/cm². Additionally, in each of the above-described cases, all the images obtained were positive.

Results with $GeS_2$ and Ag obtained by conducting the same experiments are summarized as follows. That is, images with good image quality were obtained by depositing $GeS_2$ in an amount of not more than about 3 μg/cm². The suitable amount of Ag to be deposited decreased as the amount of deposited $GeS_2$ decreased. As was the same as described above, when $GeS_2$ was deposited in an amount of about 1.5 μg/cm², good images were obtained by depositing Ag in an amount of about 1 μg/cm². All images obtained in these experiments were positive.

Similar experiments were conducted with the combination of $GeS_4$ and Ag. Extremely interesting results were obtained with respect to this combination.

First, positive images were obtained when $GeS_4$ was deposited in an amount of not more than about 1.8 μg/cm², whereas negative images were obtained when $GeS_4$ was deposited in an amount of not less than about 2.4 μg/cm². This point is extremely interesting. In the region where positive images were formed, the amount of deposited Ag sufficient to obtain good images was slightly greater than in the foregoing two cases, for example, about 2 μg/cm². However, when the amount of deposited Ag exceeded about 3 μg/cm², no images were obtained. The range of the amount of deposited $GeS_4$ where negative images were obtained is not less than about 2.4 μg/cm². When $GeS_4$ was deposited in an amount of about 2.4 μg/cm², negative images were obtained although they were not so good and, when $GeS_4$ was deposited in an amount of not less than about 3 μg/cm², good images were obtained. As to the amount of Ag to be deposited in such a case, a fairly large amount serves to provide good images, with about 3 to 4 μg/cm² being the best. When the amount of deposited Ag exceeded about 5 μg/cm², good images were not necessarily obtained.

Another aspect of this system is that, in some cases, negative images are obtained by exposure for a short time whereas positive images result upon exposure for a long period of time. This is also quite interesting.

With the system of a physically mixed layer of $GeS_{5.67}$ and Ag, positive images were obtained by depositing $GeS_{5.67}$ in an amount of not more than about 1.8 μg/cm² while negative images were obtained by depositing $GeS_{5.67}$ in an amount greater than about 1.8 μg/cm², as is the same as with the system of a physically mixed layer of $GeS_4$ and Ag. In this system too, short time exposure provides negative images while long time exposure provides positive images.

The system of $Ge_{15}S_{70}Sb_{7.5}P_{7.5}$ and Ag is also interesting, which provides negative images in most cases. However, the relationship with the amount of deposited Ag is not so greatly different from the foregoing two systems.

With the system of $Ge_{35}S_{60}Bi_5$ and Ag, interesting results as follows were observed. That is, good positive images were obtained when $Ge_{35}S_{60}Bi_5$ was deposited in an amount ranging from about 1.8 to 6 μg/cm² and Ag was deposited in an amount of not more than about 1 μg/cm². When the Ag film was thicker than this, short time exposure provided positive images while long time exposure provided negative type images.

As is seen in the above-described examples, it is apparent that a significant relationship exists between the property of the light-sensitive surface and the deposited amount of materials forming the surface, the light-sensitive surface being obtained with the composition of the invention containing germanium and sulfur and at least one of a metal and a metal compound in a physically mixed state. This will be summarized below with reference to the formation of negative or positive images.

(1) The kind of the composition containing germanium and sulfur and the deposition ratio of the composition to the metal or metal compound determines whether the resulting images are negative or positive images.

(2) When the deposited amount of the composition containing germanium and sulfur is not more than about 1.8 μg/cm², positive images often result regardless of the kind of composition containing germanium and sulfur.

(3) In order to obtain good images, the deposited amount of the composition containing germanium and sulfur must fall within a certain range dependent by the kind of composition containing germanium and sulfur and, in addition, the metal or the metal compound must be deposited in a thickness less than the thickness of the composition containing germanium and sulfur and in a ratio less than a certain level. The limit of the ratio generally can not be described but, in many cases, the maximum ratio is about 1/3, with a smaller ratio providing better results. However, when the deposited amount of the composition containing germanium and sulfur exceeds about 3 μg/cm², the maximum deposited amount of the metal or the metal compound becomes definite and is about 1 μg/cm² or less.

The processing-free type lithographic printing plate of the present invention to be obtained as described above enables printing by merely exposing the plate and immediately mounting the plate on a printing press. The printing plate possesses sufficient durability to print as many as several ten thousand impressions. Thus, the present invention is clearly an extremely useful invention from an industrial viewpoint.

The present invention will now be illustrated in greater detail by the following non-limiting examples of preferred embodiments of the present invention. Unless otherwise indicated, all parts, percents, ratios and the like are by weight, and it should be noted that a developing ink and a protective ink are employed in the following examples only in order to know whether exposed portions or non-exposed portions on a printing plate become ink-receptive by exposure or not.

EXAMPLE 1

34 mg of a composition of $Ge_{35}S_{60}Bi_5$ (the subscripts representing the atomic ratio, hereinafter the same), obtained by melting Ge of 99.999% in purity (hereinafter designated "5N"), sulfur (S) and bismuth (Bi) in vacuo and quenching, was placed in an alumina-coated tungsten basket evaporation source disposed in a vacuum-evaporating apparatus. Then, a grained, 254 × 390 mm aluminum (Al) plate was disposed in a vacuum-evaporating apparatus at a distance of about 30 cm from the above-described evaporating source, and vacuum evaporation was effected under a vacuum degree of 5 × $10^{-5}$ Torr until a monitor ("DTM-200" type, made by Sloan Ltd.) indicated a deposited amount of 1.8

μg/cm². Then, 10 mg of 5N silver (Ag) was placed in the tungsten basket evaporation source and vacuum evaporation was effected onto the sample under a degree of vacuum of $5 \times 10^{-5}$ Torr until the above-described monitor indicated a deposited amount of 1.0 μg/cm².

A sample obtained by similarly vacuum-evaporating the above-described composition and silver on a collodion film coated metal-mesh grid was observed by means of an electron microscopy. Observation of the enlarged image (30,000 X) clearly revealed that both the germanium-sulfur composition and silver formed discontinuous isles, both existing in an adjacent or a superposed condition.

The resulting sample was exposed for 20 minutes through a positive mask superposed thereon using an ultraviolet ray-exposing apparatus ("Jet Printer 2000" made by Oak Manufacturing Co., Ltd., hereinafter "Jet Printer 2000" for brevity). Then, it was mounted on a lithographic press ("320," made by A. B. Dick Ltd.). Damping water and an ink commonly used for ordinary PS printing plates were applied thereto to prepare a lithographic printing plate inked in a positive type. 500 impressions were printed using the resulting plate.

EXAMPLE 2

In manner analogous to Example 1, a composition of $Ge_{35}S_{60}Bi_5$ was vacuum-evaporated in an amount of 1.8 μg/cm² and Ag was vacuum-evaporated in an amount of 1.0 μg/cm².

After exposure for 20 minutes in the same manner as in Example 1, the material was processed with "damping water #50" (made by Fuji Photo Film Co., Ltd., hereinafter damping water for brevity) then with a developing ink (#801 made by Fuji Photo Film Co., Ltd., hereinafter developing ink for brevity). Then, the resulting sample was mounted on a printing press to prepare a lithographic printing plate inked in a positive type. 1,000 impressions were printed using this plate.

EXAMPLE 3

Ag was vacuum-evaporated in an amount of 0.5 μg/cm² in the same manner as in Example 1 to prepare a positively inked lithographic printing plate. 1,000 impressions were printed using this plate.

EXAMPLE 4

In Example 1, a rotary drum of a diameter of 13 cm and a width of 30 cm was set in such position that the central axis of the drum was at a distance of about 45 cm from an evaporation source. A $254 \times 390$ mm grained Al base plate was wound and held around the drum and rotated at a rate of 15 r.p.m. 112 mg of the $Ge_{35}S_{60}Bi_5$ composition was placed in an alumina-coated tungsten basket evaporation source and vacuum-evaporated in a deposited amount of 1.65 μg/cm².

Then, Ag was vacuum-evaporated in a deposited amount of 0.2 μg/cm².

After exposure for 20 minutes in the same manner as in Example 1, the plate was mounted on a lithographic printing press without any processing to prepare a lithographic printing plate inked in a positive type. 300 impressions were printed using this plate.

EXAMPLE 5

In a manner analogous to Example 4 except for depositing the composition of $Ge_{35}S_{60}Bi_5$ in an amount of 1.5 to 2.0 μg/cm² and Ag in an amount of 0.1 to 1 μg/cm², similar positive type lithographic printing plates were obtained.

EXAMPLE 6

In Example 1, a composition of $Ge_{35}S_{60}Bi_5$ and Ag were vacuum-evaporated in deposited amounts of 1.4 μg/cm² and 0.5 μg/cm², respectively. The resulting sample was exposed for 20 minutes through a positive mask superposed thereon using a superhigh pressure mercury lamp (250 W "501C" type, made by Ushio Electric Co., Ltd., hereinafter a 250 W mercury lamp for brevity) spaced at a distance of 40 cm. Then, after processing the sample with damping water and developing ink, it was mounted on a lithographic printing press ("HAMADASTAR 500CD," made by Hamada Insatsuki Seizo Co., Ltd.). In this case too, a lithographic printing plate inked in a positive type resulted. 500 impressions were printed using this plate.

EXAMPLE 7

In a manner analogous to Example 1, a composition of $Ge_{32}S_{63}Bi_5$ was vacuum-evaporated in a deposited amount of 2.5 μg/cm² under a vacuum degree of $2 \times 10^{-5}$ Torr and then Ag in a deposited amount of 0.13 μg/cm². After imagewise exposing for 15 minutes using Jet Printer 2000, it was mounted on an A.B. Dick 320 printing press to prepare a lithographic printing plate inked in a positive type. 2000 impressions were printed using this plate.

EXAMPLE 8

In a manner analogous to Example 1, Ag was vacuum-evaporated in a deposited amount of 0.23 μg/cm² under a vacuum degree of $4 \times 10^{-5}$ Torr then a composition of $Ge_{32}S_{63}Bi_5$ in a deposited amount of 2.2 μg/cm². After exposing for 15 minutes using Jet Printer 2000, it was mounted on an A.B. Dick 320 printing press to obtain a good lithographic printing plate inked in a positive type.

EXAMPLE 9

In a manner analogous to Example 1, a composition of $Ge_{32}S_{63}Bi_5$ was vacuum-evaporated in a deposited amount of 3.0 μg/cm² under a vacuum degree of $2 \times 10^{-5}$ Torr and then Ag was vacuum deposited in a deposited amount of 1.0 μg/cm². After exposure for 15 minutes using Jet Printer 2000, it was processed successively with damping water, protective ink ("RC-42-100" made by Kalle Ltd., hereinafter protective ink for brevity), damping water, and a desensitizing gum arabic (#905 made by Fuji Photo Film Co., Ltd., hereinafter desensitizing gum for brevity). This plate was mounted on a printing press "HAMADASTAR-700" (made by Hamada Insatsuki Seizo Co., Ltd.) to obtain a good lithographic printing plate inked in a positive type.

EXAMPLE 10

In a manner analogous to Example 1, a composition of $GeS_{1.5}$ was vacuum-evaporated in a deposited amount of 1.5 μg/cm² under a vacuum degree of $3.6 \times 10^{-5}$ Torr and then Ag was vacuum-deposited in a deposited amount of 1.0 μg/cm². After exposure for 8 minutes using a 250 W mercury lamp spaced at a distance of 30 cm, the plate was processed successively, with damping water, protective ink, damping water, and desensitizing gum to obtain a lithographic printing plate inked in a positive type.

EXAMPLE 11

In a manner analogous to Example 1, a composition of $Ge_{35}S_{65}$ was vacuum-evaporated in a deposited amount of 1.5 μg/cm² under a vacuum degree of $3.4 \times 10^{-5}$ Torr and then Ag was vacuum-deposited in a deposited amount of 1.0 μg/cm². After exposure for 8 minutes using a 250 W mercury lamp spaced at a distance of 30 cm, the plate was processed in the same manner as in Example 10 to obtain a lithographic printing plate inked in a positive type.

EXAMPLE 12

In a manner analogous to Example 1, a composition of $GeS_4$ was vacuum-evaporated on a grained and silicate-processed Al base plate in a deposited amount of 9.0 μg/cm² under a vacuum degree of $1.5 \times 10^{-5}$ Torr and then Ag was vacuum deposited in a deposited amount of 1.0 μg/cm². After exposure for 5 minutes using a 250 W mercury lamp spaced at a distance of 30 cm, the same processings as in Example 10 were conducted to obtain a lithographic printing plate inked in a negative type.

EXAMPLE 13

In a manner analogous to Example 1, a composition of $GeS_4$ was vacuum-evaporated on a grained and silicate-processed Al base plate in a deposited amount of 1.5 μg/cm² under a vacuum degree of $4 \times 10^{-5}$ Torr and then Ag was vacuum deposited in a deposited amount of 2.0 μg/cm². After exposure for 5 minutes using a 250 W mercury lamp spaced at a distance of 30 cm, the same processings as in Example 10 were conducted to obtain a lithographic printing plate inked in a positive type.

EXAMPLE 14

In a manner analogous to Example 1, a composition of $GeS_4$ was vacuum-evaporated on a grained and silicate-processed Al base plate in a deposited amount of 1.5 μg/cm² under a vacuum degree of $4 \times 10^{-5}$ and Torr and then Ag was vacuum deposited in a deposited amount of 1.0 μg/cm². After exposure for 2 minutes using a 250 W mercury lamp spaced at a distance of 30 cm, the same processings as in Example 10 were conducted to obtain a lithographic printing plate inked in a negative type. Also, when the exposure time was prolonged to 8 minutes, a lithographic printing plate inked in a positive type was obtained.

EXAMPLE 15

In a manner analogous to Example 1, a composition of $GeS_2$ was vacuum-evaporated on a grained Al base plate in a deposited amount of 3.1 μg/cm² under a vacuum degree of $5 \times 10^{-5}$ Torr and then Bi and Ag were vacuum deposited in deposited amounts of 5.0 μg/cm² and 1.0 μg/cm², respectively. After exposure for 12 minutes using a 250 W mercury lamp spaced at a distance of 30 cm, the same processings as in Example 10 were conducted to obtain a lithographic printing plate inked in a positive type.

EXAMPLE 16

In a manner analogous to Example 15, a composition of $GeS_2$ was vacuum-deposited in a deposited amount of 3.1 μg/cm², then Bi and Ag were vacuum-deposited in deposited amounts of 0.3 μg/cm² and 1.3 μg/cm², respectively, followed by conducting the same processings to obtain a lithographic printing plate inked in a positive type.

EXAMPLE 17

In a manner analogous to Example 1, a composition of $GeS_2$ was vacuum-evaporated on a grained and silicate-processed Al base plate in a deposited amount of 1.5 μg/cm² under a vacuum degree of $3.8 \times 10^{-5}$ Torr, then Ag was vacuum deposited in a deposited amount of 1.0 μg/cm². After exposure for 8 minutes using a 250 W mercury lamp spaced at a distance of 30 cm, the same processings as in Example 10 were conducted to obtain a lithographic printing plate inked in a positive type.

EXAMPLE 18

In a manner analogous to Example 1, a composition of $Ge_{42}S_{58}Ag_{0.1}$ was vacuum-evaporated in a deposited amount of 9.0 μg/cm² on a grained and silicate-processed Al base plate under a vacuum degree of $5 \times 10^{-5}$ Torr, then Ag was vacuum-evaporated in a deposited amount of 2.0 μg/cm². After exposure for 10 minutes using a 250 W mercury lamp spaced at a distance of 30 cm, the same processings as in Example 10 were conducted to obtain a lithographic printing plate inked in a positive type. Also, when the composition and Ag were respectively deposited in amounts of 3.0 μg/cm² and 1.0 μg/cm², 1.5 μg/cm² and 1.0 μg/cm², 6.0 μg/cm² and 1.0 μg/cm², 3.0 μg/cm² and 2.0 μg/cm² or 0.9 μg/cm² and 1.0 μg/cm² (not representing ranges but representing combinations), lithographic printing plates inked in a positive type were similarly obtained.

EXAMPLE 19

In a manner analogous to Example 1, a composition of $Ge_{42}S_{58}Ag_2$ was vacuum-evaporated on a grained and silicate-processed Al base plate in a deposited amount of 1.1 μg/cm² under a vacuum degree of $5 \times 10^{-5}$ Torr, then Ag was vacuum-evaporated in a deposited amount of 1.0 μg/cm². After exposure for 5 minutes using a 250 W mercury lamp spaced at a distance of 30 cm, the same processings as in Example 10 were conducted to obtain a lithographic printing plate inked in a positive type. Also, when the composition and Ag were respectively deposited in amounts of the combination of 1.5 μg/cm² and 1.0 μg/cm², 6.0 μg/cm² and 1.0 μg/cm², 3.0 μg/cm² and 1.0 μg/cm² or 2.1 μg/cm² and 1.0 μg/cm², lithographic printing plates inked in a positive type were obtained.

EXAMPLE 20

In a manner analogous to Example 1, a composition of $Ge_{15}S_{85}$ was vacuum-evaporated on a grained Al base plate in a deposited amount of 6.0 μg/cm² under a vacuum degree of $5 \times 10^{-5}$ Torr, and then Ag was vacuum-evaporated in a deposited amount of 0.5 μg/cm². After exposure for 10 minutes using a 250 W mercury lamp spaced at a distance of 30 cm, the plate was processed with damping water and developing ink in the same manner as in Example 2 to obtain a lithographic printing plate inked in a negative type.

EXAMPLE 21

In a manner analogous to Example 1, a composition of $Ge_{15}S_{85}$ was vacuum-evaporated on a grained and silicate-processed Al base plate in a deposited amount of 3.0 μg/cm² under a vacuum degree of $4 \times 10^{-5}$ Torr, and then Ag was vacuum-evaporated in a deposited amount of 3.0 μg/cm². After exposure for 1 minute using a 250 W mercury lamp spaced at a distance of 30 cm, a positive image was obtained. Then, the same processings as in Example 10 were conducted to obtain a lithographic printing plate inked in a negative type. Also, when the exposure was conducted for 10 minutes, a lithographic printing plate inked in a positive type was obtained.

EXAMPLE 22

In a manner analogous to Example 1, a composition of $Ge_{15}S_{85}$ was vacuum-evaporated on a grained and silicate-processed Al base plate in a deposited amount of 3.0 $\mu g/cm^2$ under a vacuum degree of $3 \times 10^{-5}$ Torr, and then Ag was vacuum-evaporated in a deposited amount of 1.0 $\mu g/cm^2$. After exposure for 8 minutes using a 250 W mercury lamp spaced at a distance of 30 cm, the plate was processed with damping water and protective ink as in Example 10 to obtain a lithographic printing plate inked in a negative type.

EXAMPLE 23

In a manner analogous to Example 1, a composition of $Ge_{15}S_{85}$ was vacuum-evaporated on a grained and silicate-processed Al base plate in a deposited amount of 1.5 $\mu g/cm^2$ under a vacuum degree of $4 \times 10^{-5}$ Torr, and then Ag was vacuum-evaporated in a deposited amount of 1.0 $\mu g/cm^2$. After exposure for 8 minutes using a 250 W mercury lamp spaced at a distance of 30 cm, the plate was processed with damping water and protective ink as in Example 10 to obtain a lithographic printing plate inked in a positive type.

EXAMPLE 24

In a manner analogous to Example 1, a composition of GeS was vacuum-evaporated on a grained and silicate-processed Al base plate in a deposited amount of 3.0 $\mu g/cm^2$ under a vacuum degree of $5 \times 10^{-5}$ Torr, and then Ag was vacuum-evaporated in a deposited amount of 1.0 $\mu g/cm^2$. After exposure for 8 minutes using a 250 W mercury lamp spaced at a distance of 30 cm, the plate was processed with damping water and protective ink as in Example 10 to obtain a lithographic printing plate inked in a positive type.

EXAMPLE 25

In a manner analogous to Example 1, a composition of $Ge_{36}S_{55}I_9$ was vacuum-evaporated on a grained and silicate-processed Al base plate in a deposited amount of 3.0 $\mu g/cm^2$ under a vacuum degree of $3 \times 10^{-5}$ Torr, and then Ag was vacuum-evaporated in a deposited amount of 1.0 $\mu g/cm^2$. After exposure for 8 minutes using a 250 W mercury lamp spaced at a distance of 30 cm, the plate was processed with damping water and protective ink as in Example 10 to obtain a lithographic printing plate inked in a positive type.

EXAMPLE 26

In a manner analogous to Example 1, a composition of $Ge_{20}S_{60}V_{20}$ was vacuum-evaporated on a grained and silicate-processed Al base plate in a deposited amount of 3.0 $\mu g/cm^2$ under a vacuum degree of $5 \times 10^{-5}$ Torr, and then Ag was vacuum-evaporated in a deposited amount of 2.5 $\mu g/cm^2$. After exposure for 7 minutes using a 250 W mercury lamp spaced at a distance of 30 cm, the plate was processed with damping water and protective ink as in Example 10 to obtain a lithographic printing plate inked in a positive type.

EXAMPLE 27

In a manner analogous to Example 1, a composition of $Ge_{20}S_{75}Al_5$ was vacuum-evaporated on a grained and anodic oxidation-processed Al base plate in a deposited amount of 2.4 $\mu g/cm^2$ under a vacuum degree of $5 \times 10^{-5}$ Torr, and then Ag was vacuum-evaporated in a deposited amount of 0.5 $\mu g/cm^2$. After exposure for 10 minutes using a 250 W mercury lamp spaced at a distance of 30 cm, the plate was processed with damping water, developing ink and protective ink to obtain a lithographic printing plate inked in a positive type.

EXAMPLE 28

In a manner analogous to Example 1, a composition of $Ge_{20}S_{75}Al_5$ was vacuum-evaporated on a grained and silicate-processed Al base plate under a vacuum degree of $5 \times 10^{-5}$ Torr in a deposited amount of 3.0 $\mu g/cm^2$, and then Ag was vacuum-evaporated in a deposited amount of 4.0 $\mu g/cm^2$. After exposure for 10 minutes using a 250 W mercury lamp spaced at a distance of 30 cm, the plate was processed with damping water, developing ink and protective ink as in Example 27 to obtain a lithographic printing plate inked in a negative type.

EXAMPLE 29

In a manner analogous to Example 1, a composition of $Ge_{35}S_{60}Al_{15}$ was vacuum-evaporated on a grained and silicate-processed Al base plate in a deposited amount of 3.0 $\mu g/cm^2$ under a vacuum degree of $5 \times 10^{-5}$ Torr, and then Ag was vacuum-evaporated in a deposited amount of 2.0 $\mu g/cm^2$. After exposure for 20 minutes using a 250 W mercury lamp spaced at a distance of 30 cm, the plate was processed with damping water, developing ink and protective ink as in Example 27 to obtain a lithographic printing plate inked in a positive type.

EXAMPLE 30

In a manner analogous to Example 1, a composition of $Ge_{20}S_{75}Al_5$ was vacuum-evaporated on a grained and silicate-processed Al base plate under a vacuum degree of $3 \times 10^{-5}$ Torr, and then Ag was vacuum-evaporated in a deposited amount of 2.0 $\mu g/cm^2$. After exposure for 12 minutes using a 250 W mercury lamp spaced at a distance of 30 cm, the plate was processed successively with damping water, protective ink and desensitizing gum to obtain a lithographic printing plate inked in a negative type.

EXAMPLE 31

In a manner analogous to Example 1, a composition of $Ge_{20}S_{75}Al_5$ was vacuum-evaporated on a grained and silicate-processed Al base plate in a deposited amount of 3.0 $\mu g/cm^2$ under a vacuum degree of $1 \times 10^{-5}$ Torr, and then Ag was vacuum-evaporated in a deposited amount of 2.0 $\mu g/cm^2$. After exposure for 15 minutes using a 250 W mercury lamp spaced at a distance of 30 cm, the plate was processed successively with damping water, developing ink, and desensitizing gum as in Example 30 to obtain a lithographic printing plate inked in a positive type.

EXAMPLE 32

In a manner analogous to Example 1, a composition of $Ge_{15}S_{80}Bi_5$ was vacuum-evaporated on a grained and silicate-processed Al base plate in a deposited amount of 3.0 $\mu g/cm^2$ under a vacuum degree of $5 \times 10^{-5}$ Torr, and then Ag was vacuum-evaporated in a deposited amount of 2.0 μg/cm². After exposure for 10 minutes using a 250 W mercury lamp spaced at a distance of 30 cm, the same processings as in Example 30 were conducted to obtain a lithographic printing plate inked in a positive type.

EXAMPLE 33

In a manner analogous to Example 1, a composition of $Ge_{25}S_{70}Bi_5$ was vacuum-evaporated on a grained Al base plate in a deposited amount of 3.0 μg/cm² under a vacuum degree of $5 \times 10^{-5}$ Torr, and then Ag was vacuum-evaporated in a deposited amount of 1.0 μg/cm². After exposure for 16 minutes using a 250 W mercury lamp, the plate was processed with damping water and developing ink as in Example 2 to obtain a lithographic printing plate inked in a positive type.

EXAMPLE 34

In a manner analogous to Example 1, a composition of $Ge_{25}S_{70}Bi_5$ was vacuum-evaporated on a grained Al base plate in a deposited amount of 1.8 μg/cm² under a vacuum degree of $5 \times 10^{-5}$ Torr, and then Ag was vacuum-evaporated in a deposited amount of 1.0 μg/cm². After exposure for 8 minutes using a 250 W mercury lamp spaced at a distance of 30 cm, the plate was processed with damping water and protective ink as in Example 10 to obtain a lithographic printing plate inked in a positive type.

EXAMPLE 35

In a manner analogous to Example 1, a composition of $Ge_{20}S_{70}Bi_{10}$ was vacuum-evaporated on a grained and silicate-processed Al base plate in a deposited amount of 3.0 μg/cm² under a vacuum degree of $5 \times 10^{-5}$ Torr, and then Ag was vacuum-evaporated in an average thickness of 20 Å. After exposure for 5 minutes using a 250 W mercury lamp spaced at a distance of 30 cm, the plate was processed successively with damping water, developing ink, protective ink and desensitizing gum as in Example 30 to obtain a lithographic printing plate inked in a positive type.

EXAMPLE 36

In a manner analogous to Example 1, a composition of $Ge_{20}S_{70}Bi_{10}$ was vacuum-evaporated on a grained and silicate-processed Al base plate in a deposited amount of 1.5 μg/cm² under a vacuum degree of $5 \times 10^{-5}$ Torr, and then Ag was vacuum-evaporated in a deposited amount of 10 μg/cm². After exposure for 5 minutes using a 250 W mercury lamp spaced at a distance of 30 cm, the plate was processed successively with damping water, developing ink, protective ink and desensitizing gum as in Example 30 to obtain a lithographic printing plate inked in a negative type.

EXAMPLE 37

In a manner analogous to Example 1, a composition of $Ge_{10}S_{80}Bi_{10}$ was vacuum-evaporated on a grained and silicate-processed Al base plate in a deposited amount of 3.0 μg/cm² under a vacuum degree of $5 \times 10^{-5}$ Torr, and then Ag was vacuum-evaporated in a deposited amount of 2.0 μg/cm². After exposure for 5 minutes using a 250 W mercury lamp spaced at a distance of 30 cm, the same processings as in Example 30 were conducted to obtain a lithographic printing plate inked in a positive type.

EXAMPLE 38

In a manner analogous to Example 1, a composition of $Ge_{10}S_{70}Bi_{20}$ was vacuum-evaporated on a grained and silicate-processed Al base plate in a deposited amount of 3.3 μg/cm² under a vacuum degree of $5 \times 10^{-5}$ Torr, and then, Ag was vacuum evaporated in a deposited amount of 5.0 μg/cm². After exposure for 30 seconds using a 250 W mercury lamp spaced at a distance of 30 cm, the same processings as in Example 30 were conducted to obtain a lithographic printing plate inked in a negative type.

EXAMPLE 39

In a manner analogous to Example 1, a composition of $Ge_{10}S_{70}Bi_{20}$ was vacuum-evaporated on a grained Al base plate under a vacuum degree of $5 \times 10^{-5}$ Torr, and then Ag was vacuum-evaporated in a deposited amount of 10 μg/cm². After exposure for 8 minutes using a 250 W mercury lamp spaced at a distance of 30 cm, the plate was processed with damping water, and protective ink as in Example 10 to obtain a lithographic printing plate inked in a positive type.

EXAMPLE 40

In a manner analogous to Example 1, a composition of $Ge_{30}S_{60}Bi_{10}$ was vacuum-evaporated on a grained Al base plate in a deposited amount of 9.0 μg/cm² under a vacuum degree of $5 \times 10^{-5}$ Torr, and then Ag was vacuum-evaporated in a deposited amount of 10 μg/cm². After exposure for 8 minutes using a 250 W mercury lamp spaced at a distance of 30 cm, the plate was processed with damping water and protective ink as in Example 10 to obtain a lithographic printing plate inked in a positive type.

EXAMPLE 41

In a manner analogous to Example 1, a composition of $Ge_{30}S_{60}Bi_{10}$ was vacuum-evaporated on a grained Al base plate in a deposited amount of 6.0 μg/cm² under a vacuum degree of $5 \times 10^{-5}$ Torr, and then Ag was vacuum-evaporated in a deposited amount of 1.0 μg/cm². After exposure for 8 minutes using a 250 W mercury lamp spaced at a distance of 30 cm, the plate processed with damping water and protective ink as in Example 10 to obtain a lithographic printing plate inked in a positive type.

EXAMPLE 42

In a manner analogous to Example 1, a composition of $Ge_{30}S_{60}Bi_{10}$ was vacuum-evaporated on a grained Al base plate in a deposited amount of 3.0 μg/cm² under a vacuum degree of $5 \times 10^{-5}$ Torr, and then Ag was vacuum-evaporated in a deposited amount of 1.0 μg/cm². After exposure for 4 minutes using a 250 W mercury lamp spaced at a distance of 30 cm, the plate was processed with damping water and protective ink as in Example 10 to obtain a lithographic printing plate inked in a positive type.

EXAMPLE 43

In a manner analogous to Example 1, a composition of $Ge_{35}S_{60}Bi_5$ was vacuum-evaporated on a grained Al base plate in a deposited amount of 6.0 μg/cm² under a vacuum degree of $4 \times 10^{-5}$ Torr, and then Ag was vacuum-evaporated in a deposited amount of 1.0 μg/cm². After exposure for 5 minutes using a 250 W mercury lamp spaced at a distance of 30 cm, the plate was processed with damping water and protective ink as in Example 10 to obtain a lithographic printing plate inked in a positive type.

EXAMPLE 44

In a manner analogous to Example 1, a composition of $Ge_{35}S_{60}Bi_5$ was vacuum-evaporated on a grained Al base plate in a deposited amount of 0.6 $\mu g/cm^2$ under a vacuum degree of $5 \times 10^{-5}$ Torr, and then Ag was vacuum-evaporated in a deposited amount of 1.0 $\mu g/cm^2$. After exposure for 8 minutes using a 250 W mercury lamp spaced at a distance of 30 cm, the plate was processed with damping water and protective ink as in Example 10 to obtain a lithographic printing plate inked in a negative type.

EXAMPLE 45

In a manner analogous to Example 1, a composition of $Ge_{35}S_{60}Bi_{15}$ was vacuum-evaporated on a grained Al base plate in a deposited amount of 2.1 $\mu g/cm^2$ under a vacuum degree of $4 \times 10^{-5}$ Torr, and then Ag was vacuum-evaporated in a deposited amount of 1.0 $\mu g/cm^2$. After exposure for 8 minutes using a 250 W mercury lamp spaced at a distance of 30 cm, the plate was processed with damping water and protective ink as in Example 10 to obtain a lithographic printing plate inked in a positive type.

EXAMPLE 46

In a manner analogous to Example 1, a composition of $Ge_{40}S_{60}Bi_{10}$ was vacuum-evaporated on a grained Al base plate in a deposited amount of 1.8 $\mu g/cm^2$ under a vacuum degree of $5 \times 10^{-5}$ Torr, and then Ag was vacuum-evaporated in a deposited amount of 1.0 $\mu g/cm^2$. After exposure for 8 minutes, the plate was processed with damping water and protective ink as in Example 10 to obtain a lithographic printing plate inked in a positive type.

EXAMPLE 47

In a manner analogous to Example 1, a composition of $Ge_{20}S_{80}Bi_{10}$ was vacuum-evaporated on a grained Al base plate in a deposited amount of 1.8 $\mu g/cm^2$ under a vacuum degree of $5 \times 10^{-5}$ Torr, and then Ag was vacuum-evaporated in a deposited amount of 1.0 $\mu g/cm^2$. After exposure for 8 minutes using a 250 W mercury lamp spaced at a distance of 30 cm, the plate was processed with damping water and protective ink as in Example 10 to obtain a lithograhic printing plate inked in a positive type.

EXAMPLE 48

In a manner analogous to Example 1, a composition of $Ge_{35}S_{60}Bi_2$ was vacuum-evaporated on a grained Al base plate in a deposited amount of 6.0 $\mu g/cm^2$ under a vacuum degree of $5 \times 10^{-5}$ Torr, and then Ag was vacuum-evaporated in a deposited amount of 1.0 $\mu g/cm^2$. After exposure for 8 minutes using a 250 W mercury lamp spaced at a distance of 30 cm, the plate was processed with damping water and protective ink as in Example 10 to obtain a lithographic printing plate inked in a positive type.

EXAMPLE 49

In a manner analogous to Example 1, a composition of $Ge_{35}S_{60}Bi_2$ was vacuum-evaporated on a grained Al base plate in a deposited amount of 3.6 $\mu g/cm^2$ under a vacuum degree of $5 \times 10^{-5}$ Torr, and then Ag was vacuum-evaporated in a deposited amount of 1.0 $\mu g/cm^2$. After exposure for 8 minutes using a 250 W mercury lamp spaced at a distance of 30 cm, the plate was processed with damping water and protective ink as in Example 10 to obtain a lithographic printing plate inked in a positive type.

EXAMPLE 50

In a manner analogous to Example 1, a composition of $Ge_{40}S_{60}Bi_5$ was vacuum-evaporated on a grained Al base plate in a deposited amount of 3.0 $\mu g/cm^2$ under a vacuum degree of $4 \times 10^{-5}$ Torr, and then Ag was vacuum-evaporated in a deposited amount of 3.0 $\mu g/cm^2$. After exposure for 10 minutes using a 250 W mercury lamp spaced at a distance of 30 cm, the plate was processed with damping water, developing ink and protective ink as in Example 27 to obtain a lithographic printing plate inked in a positive type.

EXAMPLE 51

In a manner analogous to Example 1, a composition of $Ge_{40}S_{60}Bi_1$ was vacuum-evaporated on a grained Al base plate in a deposited amount of 6.0 $\mu g/cm^2$ under a vacuum degree of $2 \times 10^{-5}$ Torr, then Ag was vacuum-evaporated in a deposited amount of 1.0 $\mu g/cm^2$. After exposure for 7 minutes using a 250 W mercury lamp spaced at a distance of 30 cm, the plate was processed with damping water and protective ink as in Example 10 to obtain a lithographic printing plate inked in a positive type.

EXAMPLE 52

In a manner analogous to Example 1, a composition of $Ge_{40}S_{60}Bi_1$ was vacuum-evaporated on a grained Al base plate in a deposited amount of 1.5 $\mu g/cm^2$ under a vacuum degree of $5 \times 10^{-5}$ Torr, then Ag was vacuum-evaporated thereon. After exposure for 14 minutes using a 250 W mercury lamp spaced at a distance of 30 cm, the plate was processed with damping water and protective ink as in Example 10 to obtain a lithographic printing plate inked in a positive type.

EXAMPLE 53

In a manner analogous to Example 1, a composition of $Ge_{20}S_8O_{0.2}$ was vacuum-evaporated on a grained and silicate-processed Al base plate in a deposited amount of 4.2 $\mu g/cm^2$ under a vacuum degree of $5 \times 10^{-5}$ Torr, and then Ag was vacuum-evaporated in a deposited amount of 2.0 $\mu g/cm^2$. After exposure for 12 minutes using a 250 W mercury lamp spaced at a distance of 30 cm, the plate was processed with damping water, developing ink and protective ink as in Example 27 to obtain a lithographic printing plate inked in a negative type.

EXAMPLE 54

In a manner analogous to Example 1, a composition of $Ge_{20}S_{80}O_2$ was vacuum-evaporated on a grained and silicate-processed Al base plate in a deposited amount of 9.0 $\mu g/cm^2$ under a vacuum degree of $2 \times 10^{-5}$ Torr, and then Ag was vacuum-evaporated in a deposited amount of 2.0 $\mu g/cm^2$. After exposure, for 20 minutes using a 250 W mercury lamp spaced at a distance of 30 cm, the plate was processed with damping water, protective ink and desensitizing gum as in Example 9 to obtain a lithographic printing plate inked in a negative type.

EXAMPLE 55

In a manner analogous to Example 1, a composition of $Ge_{20}S_{80}O_2$ was vacuum-evaporated on a grained and silicate-processed Al base plate in a deposited amount of 1.5 μg/cm² under a vacuum degree of $5 \times 10^{-5}$ Torr, and then Ag was vacuum-evaporated in a deposited amount of 2.0 μg/cm². After exposure for 10 minutes using a 250 W mercury lamp spaced at a distance of 30 cm, the plate was processed with damping water, protective ink and desensitizing gum as in Example 9 to obtain a lithographic printing plate inked in a positive type.

EXAMPLE 56

In a manner analogous to Example 1, a composition of $Ge_{20}S_{80}O_{20}$ was vacuum-evaporated on a gained and silicate-processed Al base plate in a deposited amount of 3.6 μg/cm² under a vacuum degree of $5 \times 10^{-5}$ Torr, and then Ag was vacuum-evaporated in a deposited amount of 6.0 μg/cm². After exposure for 3 minutes using a 250 W mercury lamp spaced at a distance of 30 cm, the plate was processed with damping water and developing ink as in Example 2 to obtain a lithographic printing plate inked in a negative type.

EXAMPLE 57

In a manner analogous to Example 1, a composition of $Ge_{20}S_{80}P_1O_2$ was vacuum-evaporated in a deposited amount of 3.0 μg/cm² on a grained and silicate-processed Al base plate under a vacuum degree of $5 \times 10^{-5}$ Torr, and then Ag was vacuum-evaporated in a deposited amount of 2.0 μg/cm². After exposure for 10 minutes using a 250 W mercury lamp spaced at a distance of 30 cm, the plate was processed with damping water, developing ink and protective ink as in Example 27 to obtain a lithographic printing plate inked in a positive type.

EXAMPLE 58

In a manner analogous to Example 1, a composition of $Ge_{20}S_{80}P_{10}O_{20}$ was vacuum-evaporated on a grained and silicate-processed Al base plate in a deposited amount of 3.3 μg/cm² under a vacuum degree of $5 \times 10^{-5}$ Torr, and then Ag was vacuum-evaporated in a deposited amount of 2.0 μg/cm². After exposure for 10 minutes using a 250 W mercury lamp spaced at a distance of 30 cm, the plate was processed with damping water, developing ink and protective ink as in Example 27 to obtain a lithographic printing plate inked in a positive type.

EXAMPLE 59

In a manner analogous to Example 1, a composition of $Ge_{30}S_{60}Sb_5P_5$ was vacuum-evaporated on a grained and silicate-processed Al base plate in a deposited amount of 3.0 μg/cm² under a vacuum degree of $5 \times 10^{-5}$ Torr, and then Ag was vacuum-evaporated in a deposited amount of 2.0 μg/cm². After exposure for 10 minutes using a 250 W mercury lamp spaced at a distance of 30 cm, the plate was processed with damping water, developing ink and protective ink as in Example 27 to obtain a lithographic printing plate inked in a positive type.

EXAMPLE 60

In a manner analogous to Example 1, a composition of $Ge_{30}S_{60}Sb_5P_5$ was vacuum-evaporated on a grained and silicate-processed Al base plate in a deposited amount of 3.0 μg/cm² under a vacuum degree of $5 \times 10^{-5}$ Torr, and then Ag was vacuum-deposited in a deposited amount of 7.0 μg/cm². After exposure for 10 minutes using a 250 W mercury lamp spaced at a distance of 30 cm, the plate was processed with damping water, developing ink and protective ink as in Example 27 to obtain a lithographic printing plate inked in a negative type.

EXAMPLE 61

In a manner analogous to Example 1, a composition of $Ge_{15}S_{70}Sb_{7.5}P_{7.5}$ was vacuum-evaporated on a grained and silicate-processed Al base plate in a deposited amount of 3.0 μg/cm² under a vacuum degree of $5 \times 10^{-5}$ Torr, and then Ag was vacuum-evaporated in a deposited amount of 2.0 μg/cm². After exposure for 15 minutes using a 250 W mercury lamp spaced at a distance of 30 cm, the plate was processed with damping water, protective ink and desensitizing gum as in Example 9 to obtain a lithographic printing plate inked in a positive type.

EXAMPLE 62

In a manner analogous to Example 1, a composition of $Ge_{10}S_8P_{10}Pd_{0.5}$ was vacuum-evaporated on a grained and silicate-processed Al base plate in a deposited amount of 3.3 μg/cm² under a vacuum degree of $5 \times 10^{-5}$ Torr, and then Ag was vacuum-evaporated in a deposited amount of 2.0 μg/cm². After exposure for 10 minutes using a 250 W mercury lamp spaced at a distance of 30 cm, the plate was processed with damping water, developing ink and protective ink as in Example 27 to obtain a lithographic printing plate inked in a negative type.

EXAMPLE 63

In a manner analogous to Example 1, a composition of $Ge_{10}S_8P_{10}Pd_5$ was vacuum-evaporated on a grained and silicate-processed Al base plate in a deposited amount of 3.6 μg/cm² under a vacuum degree of $5 \times 10^{-5}$ Torr, and then Ag was vacuum-evaporated in a deposited amount of 2.0 μg/cm². After exposure for 10 minutes using a 250 W mercury lamp spaced at a distance of 30 cm, the plate was processed with damping water, developing ink and protective ink as in Example 27 to obtain a lithographic printing plate inked in a negative type.

EXAMPLE 64

In a manner analogous to Example 1, a composition of $Ge_{10}S_{80}P_{10}Bi_{10}$ was vacuum-evaporated on a grained and silicate-processed Al base plate in a deposited amount of 3.0 μg/cm² under a vacuum degree of $5 \times 10^{-5}$ Torr, and then Ag was vacuum-evaporated in a deposited amount of 2.0 μg/cm². After exposure for 12 minutes using a 250 W mercury lamp spaced at a distance of 30 cm, the plate was processed with damping water, developing ink and protective ink as in Example 27 to obtain a lithographic printing plate inked in a negative type.

EXAMPLE 65

In a manner analogous to Example 1, a composition of $Ge_{35}S_{60}Bi_5P_5$ was vacuum-evaporated on a grained Al base plate in a deposited amount of 3.0 μg/cm² under a vacuum degree of $1 \times 10^{-5}$ Torr, and then Ag vacuum-evaporated in a deposited amount of 1.0 μg/cm².

After exposure for 23 minutes using a 250 W mercury lamp spaced at a distance of 30 cm, the plate was processed with a damping water, developing ink and protective ink as in Example 27 to obtain a lithographic printing plate inked in a positive type.

EXAMPLE 66

In a manner analogous to Example 1, a composition of $Ge_{35}S_{60}Bi_5I_5$ was vacuum-evaporated in a deposited amount of 3.0 μg/cm² under a vacuum degree of $5 \times 10^{-5}$ Torr, and then Ag vacuum-evaporated in a deposited amount of 1.0 μg/cm². After exposure for 8 minutes using a 250 W mercury lamp spaced at a distance of 30 cm, the plate was processed with damping water and protective ink as in Example 10 to obtain a lithographic printing plate inked in a positive type.

EXAMPLE 67

In a manner analogous to Example 1, a composition of $Ge_{15}S_{70}Sb_{7.5}P_{7.5}$ was vacuum-evaporated on a grained and silicate-processed Al base plate in a deposited amount of 6.0 μg/cm² under a vacuum degree of $5 \times 10^{-5}$ Torr, and then Ag vacuum-evaporated in a deposited amount of 3.0 μg/cm². After exposure for 3 minutes using a 250 W mercury lamp spaced at a distance of 30 cm, the plate was processed with damping water and developing ink as in Example 2 to obtain a lithographic printing plate inked in a negative type.

EXAMPLE 68

In a manner analogous to Example 1, a composition of $GeS_2$ was vacuum-evaporated on a grained Al base plate in a deposited amount of 3.0 μg/cm² under a vacuum degree of $5 \times 10^{-5}$ Torr, and then Ag vacuum-evaporated in a deposited amount of 2.5 μg/cm². After exposure for 1.5 minutes using a 250 W mercury lamp spaced at a distance of 30 cm, the plate was processed with damping water and developing ink as in Example 2 to obtain a lithographic printing plate inked in a negative type.

EXAMPLE 69

In a manner analogous to Example 1, a composition of $Ge_{34}S_{64}I_2$ was vacuum-evaporated on a grained and silicate-processed Al base plate in a deposited amount of 3.5 μg/cm² under a vacuum degree of $5 \times 10^{-5}$ Torr, and then Ag vacuum-evaporated in a deposited amount of 2.0 μg/cm². After exposure for 1 minute using a 250 W mercury lamp spaced at a distance of 30 cm, the plate was processed with damping water and protective ink as in Example 10 to obtain a lithographic printing plate inked in a positive type.

EXAMPLE 70

In a manner analogous to Example 1, a composition of $Ge_{30}S_{60}P_{10}$ was vacuum-evaporated on a grained Al base plate in a deposited amount of 3.0 μg/cm² under a vacuum degree of $5 \times 10^{-5}$ Torr, and then Ag vacuum-evaporated in a deposited amount of 1.0 μg/cm². After exposure for 4 minutes using a 250 W mercury lamp spaced at a distance of 30 cm, the plate was processed with damping water and protective ink as in Example 10 to obtain a lithographic printing plate inked in a positive type.

EXAMPLE 71

In a manner analogous to Example 1, a composition of $Ge_{30}S_{60}Sb_{10}$ was vacuum-evaporated on a grained Al base plate in a deposited amount of 3.0 μg/cm² under a vacuum degree of $5 \times 10^{-5}$ Torr, and then Ag vacuum-evaporated in a deposited amount of 1.0 μg/cm². After exposure for 4 minutes using a 250 W mercury lamp spaced at a distance of 30 cm, the plate was processed with damping water and protective ink as in Example 10 to obtain a lithographic printing plate inked in a positive type.

EXAMPLE 72

In a manner analogous to Example 1, a composition of $Ge_{25}S_{50}Sb_{25}$ was vacuum-evaporated on a grained Al base plate in a deposited amount of 3.0 μg/cm² under a vacuum degree of $5 \times 10^{-5}$ Torr, and then Ag vacuum-evaporated in a deposited amount of 1.0 μg/cm². After exposure for 4 minutes using a 250 W mercury lamp spaced at a distance of 30 cm, the plate was processed with damping water and protective ink as in Example 10 to obtain a lithographic printing plate inked in a positive type.

EXAMPLE 73

In a manner analogous to Example 1, a composition of $Ge_{35}S_{60}Bi_5$ was vacuum-evaporated on a grained and silicate-processed Al base plate in a deposited amount of 3.0 μg/cm² under a vacuum degree of $2 \times 10^{-5}$ Torr, and then Ag vacuum-evaporated in a deposited amount of 1.0 μg/cm². After exposure for 4 minutes using a 250 W mercury lamp spaced at a distance of 30 cm, the plate was processed with damping water and protective ink as in Example 10 to obtain a lithographic printing plate inked in a positive type. Also, when exposure was conducted for 8 minutes, a negatively inked lithographic printing plate was obtained.

EXAMPLE 74

In a manner analogous to Example 1, a composition of $Ge_{33.3}S_{66.7}Bi_5$ was vacuum-evaporated on a grained Al base plate in a deposited amount of 1.8 μg/cm² under a vacuum degree of $5 \times 10^{-5}$ Torr, and then Ag vacuum-evaporated in a deposited amount of 1.0 μg/cm². After exposure for 2 minutes using a 250 W mercury lamp spaced at a distance of 30 cm, the plate was processed with damping water and protective ink as in Example 10 to obtain a lithographic printing plate inked in a positive type. Also, when exposure was conducted for 16 minutes, a lithographic printing plate inked in a negative type was obtained.

EXAMPLE 75

In a manner analogous to Example 1, a composition of $Ge_{33.3}S_{66.7}Bi_5$ was vacuum-evaporated on a grained Al base plate in a deposited amount of 4.5 μg/cm² under a vacuum degree of $4 \times 10^{-5}$ Torr, and then Ag vacuum-evaporated in a deposited amount of 3.0 μg/cm². After exposure for 2 minutes using a 250 W mercury lamp spaced at a distance of 30 cm, the plate was processed with damping water and protective ink as in Example 10 to obtain a lithographic printing plate inked in a positive type. Also, when exposure was conducted for 8 minutes, a lithographic printing plate inked in a negative type was obtained.

EXAMPLE 76

In a manner analogous to Example 1, a composition of $Ge_{10}S_{80}P_{10}Bi_{10}$ was vacuum-evaporated on a grained and silicate-processed Al base plate in a deposited amount of 3.0 μg/cm² under a vacuum degree of $5 \times$

EXAMPLE 77

In a manner analogous to Example 1, a composition of $Ge_{20}S_{80}O_2$ was vacuum-evaporated on a grained and silicate-processed Al base plate in a deposited amount of 3.0 $\mu g/cm^2$ under a vacuum degree of $4 \times 10^{-5}$ Torr, and then Ag vacuum-evaporated in a deposited amount of 4.0 $\mu g/cm^2$. After exposure for 1 minute using a 250 W mercury lamp spaced at a distance of 30 cm, the plate was processed with damping water and protective ink as in Example 10 to obtain a lithographic printing plate inked in a negative type. Also, when exposure was conducted for 14 minutes, a lithographic printing plate inked in a positive type was obtained.

EXAMPLE 78

In a manner analogous to Example 1, a composition of $Ge_{15}S_{70}Sb_{7.5}P_{7.5}$ was vacuum-evaporated on a grained and silicate-processed Al base plate in a deposited amount of 3.0 $\mu g/cm^2$ under a vacuum degree of $5 \times 10^{-5}$ Torr, and then Ag vacuum-evaporated in a deposited amount of 1.0 $\mu g/cm^2$. After exposure for 1 minute using a 250 W mercury lamp spaced at a distance of 30 cm, the plate was processed with damping water and protective ink as in Example 10 to obtain a lithographic printing plate inked in a negative type. Also, when exposure was conducted for 10 minutes, a lithographic printing plate inked in a positive type was obtained.

EXAMPLE 79

In a manner analogous to Example 1, a composition of $Ge_{35}S_{60}Bi_5$ was vacuum-evaporated on a grained and silicate-processed Al base plate in a deposited amount of 3.3 $\mu g/cm^2$ under a vacuum degree of $5 \times 10^{-5}$ Torr, and then $Ag_2S$ vacuum-evaporated in a deposited amount of 3.6 $\mu g/cm^2$. After exposure for 10 minutes using a 250 W mercury lamp spaced at a distance of 30 cm, the plate was processed with damping water and protective ink as in Example 10 to obtain a lithographic printing plate inked in a negative type.

EXAMPLE 80

In a manner analogous to Example 1, a composition of $Ge_{33.3}S_{66.7}Bi_5$ was vacuum-evaporated on a grained Al base plate in a deposited amount of 3.0 $\mu g/cm^2$ under a vacuum degree of $5 \times 10^{-5}$ Torr, and the AgI vacuum-evaporated in a deposited amount of 0.6 $\mu g/cm^2$. After exposure for 10 minutes a 250 W mercury lamp spaced at a distance of 30 cm, the plate was processed with damping water and protective ink as in Example 10 to obtain a lithographic printing plate inked in a positive type.

EXAMPLE 81

In a manner analogous to Example 1, composition of $GeS_4$ was vacuum-evaporated on a grained and silicate-processed Al base plate in a deposited amount of 6.0 $\mu g/cm^2$ under a vacuum degree of $5 \times 10^{-5}$ Torr, and then $Ag_4P_2O_7$ vacuum-evaporated in a deposited amount of 2.7 $\mu g/cm^2$. After exposure for 10 minutes using a 250 W mercury lamp spaced at a distance of 30 cm, the plate was processed with damping water and developing ink as in Example 2 to obtain a lithographic printing plate inked in a negative type.

EXAMPLE 82

In a manner analogous to Example 1, Ag was vacuum-evaporated on a grained and silicate-processed Al base plate in a deposited amount of 1.0 $\mu g/cm^2$ under a vacuum degree of $2 \times 10^{-5}$ Torr, then a composition of $Ge_{35}S_{60}Bi_5$ vacuum-evaporated in a deposited amount of 0.6 $\mu g/cm^2$. After exposure for 8 minutes using a 250 W mercury lamp spaced at a distance of 30 cm, the plate was processed with damping water and protective ink as in Example 10 to obtain a lithographic printing plate inked in a negative type.

EXAMPLE 83

In a manner analogous to Example 1, Ag was vacuum-evaporated on a grained and silicate-processed Al base plate in a deposited amount of 1.0 $\mu g/cm^2$ under a vacuum degree of $4 \times 10^{-5}$ Torr, then a composition of $Ge_{35}S_{60}Bi_5$ vacuum-evaporated in a deposited amount of 3.0 $\mu g/cm^2$. After exposure for 8 minutes using a 250 W mercury lamp spaced at a distance of 30 cm, the plate was processed with damping water and protective ink as in Example 10 to obtain a lithographic printing plate inked in a positive type.

EXAMPLE 84

In a manner analogous to Example 1, Ag was vacuum-evaporated on a grained and silicate-processed Al base plate in a deposited amount of 2.0 $\mu g/cm^2$ under a vacuum degree of $5 \times 10^{-5}$ Torr, and then a composition of $Ge_{35}S_{60}Bi_5$ vacuum-evaporated in a deposited amount of 6.0 $\mu g/cm^2$. After exposure for 8 minutes using a 250 W mercury lamp spaced at a distance of 30 cm, the plate was processed with damping water and protective ink as in Example 10 to obtain a lithographic printing plate inked in a positive type.

EXAMPLE 85

In a manner analogous to Example 1, a composition of $Ge_{15}S_{70}Sb_{7.5}P_{7.5}$ was vacuum-evaporated on a grained Al base plate in a deposited amount of 1.8 $\mu g/cm^2$ under a degree of $5 \times 10^{-5}$ Torr, and then Ag vacuum-evaporated in a deposited amount of 1.0 $\mu g/cm^2$. After exposure for 10 minutes using a 250 W mercury lamp spaced at a distance of 30 cm, the plate was processed with damping water and protective ink as in Example 10 to obtain a lithographic printing plate inked in a negative type.

EXAMPLE 86

In a manner analogous to Example 1, a composition of $Ge_{20}S_{80}O_{20}$ was vacuum-evaporated on a grained Al base plate in a deposited amount of 3.0 $\mu g/cm^2$ under a vacuum degree of $1 \times 10^{-5}$ Torr, and then Ag vacuum-evaporated in a deposited amount of 2.0 $\mu g/cm^2$. After exposure for 15 minutes using Jet Printer 2000, the plate was mounted on a printer "HAMADASTAR-700" (trade name) produced by Hamada Insatsu Kikai Co., Ltd., to obtain a good lithographic printing plate inked in a positive type.

EXAMPLE 87

10 mg of a composition of $GeS_2$, obtained by melting Ge and S in vacuo and quenching, and 100 mg of $Ag_4P_2O_7$ were separately placed in a molybdenum board evaporation source, and vacuum-evaporated on a grained and silicate-processed Al base plate in a deposited amount of 7.5 $\mu g/cm^2$. After exposure for 10 minutes using a 250 W mercury lamp spaced at a distance of 30 cm, the plate was processed with damping water and developing ink as in Example 2 to obtain a lithographic printing plate inked in a negative type.

EXAMPLE 88

In a manner analogous to Example 1, 100 mg of a composition of $GeS_{5.7}$ and 30 mg of Ag were placed in the same alumina-coated tungsten basket evaporation source, and vacuum-evaporated on a grained and silicate-processed Al base plate in a deposited amount of 1.8 $\mu g/cm^2$ under a vacuum degree of $2 \times 10^{-5}$ Torr. After exposure for 3 minutes using a 250 W mercury lamp spaced at a distance of 30 cm, the plate was processed with damping water and protective ink as in Example 10 to obtain a lithographic printing plate inked in a negative type.

EXAMPLE 89

In a manner analogous to Example 1, Ni was vacuum-evaporated on a grained Al base plate in a deposited amount of 0.5 $\mu g/cm^2$ under a vacuum degree of $4 \times 10^{-5}$ Torr, then a composition of $Ge_{30}S_{60}Bi_5$ vacuum-evaporated in a deposited amount of 2.2 $\mu g/cm^2$. After exposure for 8 minutes using Jet Printer 2000, the plate was processed with damping water and protective ink as in Example 10 to obtain a lithographic printing plate inked in a positive type.

EXAMPLE 90

In a manner analogous to Example 1, Co was vacuum-evaporated on a grained Al base plate in a deposited amount of 0.4 $\mu g/cm^2$ under a vacuum degree of $4 \times 10^{-5}$ Torr, and then a composition of $Ge_{35}S_{60}Bi_5$ vacuum-evaporated in a deposited amount of 2.3 $\mu g/cm^2$. After exposure for 8 minutes using Jet Printer 2000, the plate was processed with damping water and protective ink as in Example 10 to obtain a lithographic printing plate inked in a positive type.

EXAMPLE 91

In a manner analogous to Example 1, Mn was vacuum-evaporated on a grained Al base plate in a deposited amount of 0.4 $\mu g/cm^2$ under a vacuum degree of $0.8 \times 10^{-5}$ Torr, and then a composition of $Ge_{35}S_{60}Bi_5$ vacuum-evaporated in a deposited amount of 2.2 $\mu g/cm^2$. After exposure for 8 minutes using Jet Printer 2000, the plate was processed with damping water and protective ink as in Example 10 to obtain a lithographic printing plate inked in a positive type.

EXAMPLE 92

In a manner analogous to Example 1, Bi was vacuum-evaporated on a grained Al base plate in a deposited amount of 0.5 $\mu g/cm^2$ under a vacuum degree of $3 \times 10^{-5}$ Torr, then a composition of $Ge_{35}S_{60}Bi_5$ vacuum-evaporated in a deposited amount of 2.2 $\mu g/cm^2$. After exposure for 8 minutes using Jet Printer 2000, the plate was processed with damping water and protective ink as in Example 10 to obtain a lithographic printing plate inked in a positive type.

EXAMPLE 93

In a manner analogous to Example 1, Mg was vacuum-evaporated on a grained Al base plate in a deposited amount of 0.1 $\mu g/cm^2$ under a vacuum degree of $4 \times 10^{-5}$ Torr, and then a composition of $Ge_{35}S_{60}Bi_5$ vacuum-evaporated in a deposited amount of 3.3 $\mu g/cm^2$. After exposure for 8 minutes using Jet Printer 2000, the plate was processed with damping water and protective ink as in Example 10 to obtain a lithographic printing plate inked in a positive type.

EXAMPLE 94

In a manner analogous to Example 1, Pd was vacuum-evaporated on a grained Al base plate in a deposited of 0.6 $\mu g/cm^2$ under a vacuum degree of $4 \times 10^{-5}$ Torr, and then a composition of $Ge_{35}S_{60}Bi_5$ vacuum-evaporated in a deposited amount of 2.2 $\mu g/cm^2$. After exposure for 8 minutes using Jet Printer 2000, the plate was processed with damping water and protective ink as in Example 10 to obtain a lithographic printing plate inked in a positive type.

EXAMPLE 95

In a manner analogous to Example 1, Te was vacuum-evaporated on a grained Al base plate in a deposited amount of 0.3 $\mu g/cm^2$ under a vacuum degree of $4 \times 10^{-5}$ Torr, and then a composition of $Ge_{35}S_{60}Bi_5$ vacuum-evaporated in a deposited amount of 2.2 $\mu g/cm^2$. After exposure for 8 minutes using Jet Printer 2000, the plate was processed with damping water and protective ink as in Example 10 to obtain a lithographic printing plate inked in a positive type.

EXAMPLE 96

In a manner analogous to Example 1, Sb was vacuum-evaporated on a grained Al base plate in a deposited amount of 0.3 $\mu g/cm^2$ under a vacuum degree of $4 \times 10^{-5}$ Torr, and then a composition of $Ge_{35}S_{60}Bi_5$ vacuum-evaporated in a deposited amount of 2.3 $\mu g/cm^2$. After exposure for 8 minutes using Jet Printer 2000, the plate was processed with damping water and protective ink as in Example 10 to obtain a lithographic printing plate inked in a positive type.

EXAMPLE 97

In a manner analogous to Example 1, Pb was vacuum-evaporated on a grained Al base plate in a deposited amount of 0.6 $\mu g/cm^2$ under a vacuum degree of $4 \times 10^{-5}$ Torr, and then a composition of $Ge_{35}S_{60}Bi_5$ vacuum-evaporated in a deposited amount of 2.2 $\mu g/cm^2$. After exposure for 8 minutes using Jet Printer 2000, the plate was processed with damping water and protective ink as in Example 10 to obtain a lithographic printing plate inked in a positive type.

EXAMPLE 98

In a manner analogous to Example 1, Tl was vacuum-evaporated on a grained Al base plate in a deposited amount of 0.6 $\mu g/cm^2$ under a vacuum degree of $4 \times 10^{-5}$ Torr, and then a composition of $Ge_{35}S_{60}Bi_5$ vacuum-evaporated in a deposited amount of 2.2 $\mu g/cm^2$. After exposure for 8 minutes using Jet Printer 2000, the plate was processed with damping water and protective ink as in Example 10 to obtain a lithographic printing plate inked in a positive type.

EXAMPLE 99

In a manner analogous to Example 1, Cd was vacuum-evaporated on a grained Al base plate in a deposited amount of 0.4 μg/cm² under a vacuum degree of $1 \times 10^{-5}$ Torr, and then a composition of $Ge_{35}S_{60}Bi_5$ vacuum-evaporated in a deposited amount of 2.2 μg/cm². After exposure for 8 minutes using Jet Printer 2000, the plate was processed with damping water and protective ink as in Example 10 to obtain a lithographic printing plate inked in a positive type.

EXAMPLE 100

In a manner analogous to Example 1, Fe was vacuum-evaporated on a grained Al base plate in a deposited amount of 0.4 μg/cm² under a vacuum degree of $2 \times 10^{-5}$ Torr, and then a composition of $Ge_{35}S_{60}Bi_5$ vacuum-evaporated in a deposited amount of 2.2 μg/cm². After exposure for 8 minutes using Jet Printer 2000, the plate was processed with damping water and protective ink as in Example 10 to obtain a lithographic printing plate inked in a positive type.

EXAMPLE 101

In a manner analogous to Example 1, Cr was vacuum-evaporated on a grained Al base plate in a deposited amount of 0.4 μg/cm² under a vacuum degree of $5 \times 10^{-5}$ Torr, and then a composition of $Ge_{35}S_{60}Bi_5$ vacuum-evaporated in a deposited amount of 2.2 μg/cm². After exposure for 8 minutes using Jet Printer 2000, the plate was processed with damping water and protective ink as in Example 10 to obtain a lithographic printing plate inked in a positive type.

EXAMPLE 102

In a manner analogous to Example 1, Se was vacuum-evaporated on a grained Al base plate in a deposited amount of 0.2 μg/cm² under a vacuum degree of $5 \times 10^{-5}$ Torr, and then a composition of $Ge_{35}S_{60}Bi_5$ vacuum-evaporated in a deposited amount of 2.2 μg/cm². After exposure for 8 minutes using Jet Printer 2000, the plate was processed with damping water and protective ink as in Example 10 to obtain a lithographic printing plate inked in a positive type.

EXAMPLE 103

In a manner analogous to Example 1, vanadium was vacuum-evaporated on a grained Al base plate in a deposited amount of 0.3 μg/cm² under a vacuum degree of $4 \times 10^{-5}$ Torr, and then a composition of $Ge_{35}S_{60}Bi_5$ vacuum-evaporated in a deposited amount of 2.3 μg/cm². After exposure for 8 minutes using Jet Printer 2000, the plate was processed with damping water and protective ink as in Example 10 to obtain a lithographic printing plate inked in a positive type.

EXAMPLE 104

In a manner analogous to Example 1, Sn was vacuum-evaporated on a grained Al base plate in a deposited amount of 0.3 μg/cm² under a vacuum degree of $5 \times 10^{-5}$ Torr, and then a composition of $Ge_{35}S_{60}Bi_5$ vacuum-evaporated in a deposited amount of 2.2 μg/cm². After exposure for 8 minutes using Jet Printer 2000, the plate was processed with damping water and protective ink as in Example 10 to obtain a lighographic printing plate inked in a positive type.

EXAMPLE 105

In a manner analogous to Example 1, Ge was vacuum-evaporated on a grained Al base plate in a deposited amount of 0.3 μg/cm² under a vacuum degree of $4 \times 10^{-5}$ Torr, and then a composition of $Ge_{35}S_{60}Bi_5$ vacuum-evaporated in a deposited amount of 2.2 μg/cm². After exposure for 8 minutes using Jet Printer 2000, the plate was processed with damping water and protective ink as in Example 10 to obtain a lithographic printing plate inked in a positive type.

EXAMPLE 106

In a manner analogous to Example 1, In was vacuum-evaporated on a grained Al base plate in a deposited amount of 0.4 μg/cm² under a vacuum degree of $4 \times 10^{-5}$ Torr, and then a composition of $Ge_{35}S_{60}Bi_5$ vacuum-evaporated in a deposited amount of 2.3 μg/cm². After exposure for 8 minutes using Jet Printer 2000, the plate was processed with damping water and protective ink as in Example 10 to obtain a lithographic printing plate inked in a positive type.

EXAMPLE 107

In a manner analogous to Example 1, Ga was vacuum-evaporated on a grained Al base plate in a deposited amount of 0.3 μg/cm² under a vacuum degree of $2 \times 10^{-5}$ Torr, and then a composition of $Ge_{35}S_{60}Bi_5$ vacuum-evaporated in a deposited amount of 2.2 μg/cm². After exposure for 8 minutes using Jet Printer 2000, the plate was processed with damping water and protective ink as in Example 10 to obtain a lithographic printing plate inked in a positive type.

EXAMPLE 108

In a manner analogous to Example 1, Cu was vacuum-evaporated on a grained Al base plate in a deposited amount of 0.5 μg/cm² under a vacuum degree of $4 \times 10^{-5}$ Torr, and then a composition of $Ge_{35}S_{60}Bi_5$ vacuum-evaporated in a deposited amount of 2.3 μg/cm². After exposure for 8 minutes using Jet Printer 2000, the plate was processed with damping water and protective ink as in Example 10 to obtain a lithographic printing plate inked in a positive type.

EXAMPLE 109

In a manner analogous to Example 1, Au was vacuum-evaporated on a grained Al base plate in a deposited amount of 1.0 μg/cm² under a vacuum degree of $4 \times 10^{-5}$ Torr, and then a composition of $Ge_{35}S_{60}Bi_5$ vacuum-evaporated in a deposited amount of 2.2 μg/cm². After exposure for 8 minutes using Jet Printer 2000, the plate was processed with damping water and protective ink as in Example 10 to obtain a lithographic printing plate inked in a positive type.

EXAMPLE 110

In a manner analogous to Example 1, Au was vacuum-evaporated on a grained Al base plate in a deposited amount of 1.2 μg/cm² under a vacuum degree of $1 \times 10^{-5}$ Torr, and then a composition of $Ge_{35}S_{60}Bi_5$ vacuum-evaporated in a deposited amount of 2.2 μg/cm². After exposure for 8 minutes using Jet Printer 2000, the plate was processed with damping water and protective ink as in Example 10 to obtain a lithographic printing plate inked in a positive type.

EXAMPLE 111

In a manner analogous to Example 1, a composition of $Ge_{35}S_{60}Bi_5$ was vacuum-evaporated on a grained Al base plate in a deposited amount of 2.3 µg/cm² under a vacuum degree of $2 \times 10^{-5}$ Torr, and then Cu vacuum-evaporated in a deposited amount of 2.3 µg/cm². After exposure for 9 minutes using Jet Printer 2000, the plate was directly mounted on an A.B. Dick 320 printing press to obtain a lithographic printing plate inked in a positive type. 500 impressions were printed using this plate.

EXAMPLE 112

In a manner analogous to Example 1, a composition of $Ge_{35}S_{60}P_5$ was vacuum-evaporated on a grained Al base plate in a deposited amount of 2.4 µg/cm² under a vacuum degree of $4 \times 10^{-5}$ Torr, and then Al vacuum-evaporated in a deposited amount of 0.13 µg/cm². After exposure for 9 minutes using Jet Printer 2000, the plate was directly mounted on an A.B. Dick 320 printing press to obtain a lithographic printing plate inked in a positive type.

EXAMPLE 113

In a manner analogous to Example 1, a composition of $Ge_{35}S_{60}Bi_5$ was vacuum-evaporated on a grained Al base plate in a deposited amount of 2.5 µg/cm² under a vacuum degree of $2 \times 10^{-5}$ Torr, and then Au vacuum-evaporated in a deposited amount of 1.0 µg/cm². After exposure for 9 minutes using Jet Printer 2000, the plate was directly mounted on an A.B. Dick 320 printing press to obtain a lithographic printing plate inked in a positive type. 100 impressions were printed by using this plate.

EXAMPLE 114

In a manner analogous to Example 1, a composition of $Ge_{35}S_{60}P_5$ was vacuum-evaporated on a grained Al base plate in a deposited amount of 2.3 µg/cm² under a vacuum degree of $4 \times 10^{-5}$ Torr, and then Sn vacuum-evaporated in a deposited amount of 0.2 µg/cm². After exposure for 9 minutes using Jet Printer 2000, the plate was directly mounted on an A.B. Dick 320 printing press to obtain a lithographic printing plate inked in a positive type. 500 impressions were printed by using this plate.

EXAMPLE 115

In a manner analogous to Example 1, a composition of $Ge_{45}S_{60}Bi_5$ was vacuum-evaporated on a grained Al base plate in a deposited amount of 2.6 µg/cm² under a vacuum degree of $3 \times 10^{-5}$ Torr, and then Ag vacuum-evaporated in a deposited amount of 0.3 µg/cm². After exposure for 9 minutes using Jet Printer 2000, the plate was directly mounted on an A.B. Dick 320 printing press to obtain a lithographic printing plate inked in a positive type. 1,000 impressions were printed by using this plate.

EXAMPLE 116

A rotary drum of a diameter of 10 cm and a width of 12 cm was set in a vacuum trough and a grained, $120 \times 390$ mm Al base plate was wound around the rotary drum. A $5 \times 12$ cm silver plate electrode was faced toward the drum. After evacuating the vacuum trough to a vacuum degree of $1 \times 10^{-5}$ Torr, Ar was introduced thereinto to a vacuum degree of $6.5 \times 10^{-2}$ Torr. A direct current electric potential of 610 V was applied between the silver plate electrode and the rotary drum to conduct D.C. sputtering, thus depositing Ag on the Al base plate. Sputtering was effected for 200 seconds with an applied electric power being 0.041 W.cm² to form a film of 6 Å as an average thickness. Then, in a manner analogous to Example 1, a composition of $Ge_{35}S_{60}P_5$ was vacuum-evaporated in a deposited amount of 2.4 µg/cm² under a vacuum degree of $5 \times 10^{-5}$ Torr. After exposure for 9 minutes using Jet Printer 2000, the plate was directly mounted on an A.B. Dick printing press to obtain a lithographic printing plate inked in a positive type. 500 impressions were printed by using this plate.

EXAMPLE 117

In a manner analogous to Example 116, a composition of $Ge_{35}S_{60}P_5$ was vacuum-evaporated in a deposited amount of 2.4 µg/cm², followed by forming an Ag film thereon in a deposited amount of 0.6 µg/cm² through D.C. sputtering. After exposure for 9 minutes using Jet Printer 2000, the plate was directly mounted on an A.B. Dick printing press to obtain a good lithographic printing plate inked in a positive type.

EXAMPLE 118

In a manner analogous to Example 1, a composition of $Ge_{35}S_{60}Bi_5$ was vacuum-evaporated in a deposited amount of 1.8 µg/cm² under a vacuum degree of $5 \times 10^{-5}$ Torr on a grained, porous chromium-plated Al base plate having been immersed for 1 minute in a 2.5% sodium silicate aqueous solution at 70° C., and then Ag vacuum-evaporated in a deposited amount of 0.5 µg/cm². After exposure for 2 minutes using a 250 W mercury lamp spaced at a distance of 30 cm, the plate was processed with damping water and developing ink to obtain a lithographic printing plate inked in a positive type.

EXAMPLE 119

In a manner analogous to Example 1, $Fe_2S_3$ was vacuum-evaporated on a grained Al base plate in a deposited amount of 0.5 µg/cm² under a vacuum degree of $5 \times 10^{-5}$ Torr, and then a composition of $Ge_{35}S_{60}Bi_5$ vacuum-evaporated in a deposited amount of 1.8 µg/cm². After exposure for 1 minute using a 250 W mercury lamp spaced at a distance of 30 cm, the plate was processed with damping water and developing ink as in Example 2 to obtain a lithographic printing plate inked in a positive type. Also, when exposure was conducted for 4 minutes, a lithographic printing plate inked in a negative type was obtained.

EXAMPLE 120

In a manner analogous to Example 1, PbS was vacuum-evaporated on an Al base plate in a deposited amount of 0.4 µg/cm² under a vacuum degree of $5 \times 10^{-5}$ Torr, then a composition of $Ge_{35}S_{60}Bi_5$ vacuum-evaporated in a deposited amount of 1.8 µg/cm². After exposure for 4 minutes using a 250 W mercury lamp spaced at a distance of 30 cm, the plate was processed with damping water and developing ink as in Example 2 to obtain a lithographic printing plate inked in a positive type.

EXAMPLE 121

In a manner analogous to Example 1, $Ag_2S$ was vacuum-evaporated on a grained Al base plate in a deposited amount of 0.4 μg/cm² under a vacuum degree of 5 × 10⁻⁵ Torr, and then a composition of Ge₃₅S₆₀Bi₅ vacuum-evaporated in a deposited amount of 1.8 μg/cm². After exposure for 4 minutes using a 250 W mercury lamp spaced at a distance of 30 cm, the plate was processed with damping water and developing ink as in Example 2 to obtain a lithographic printing plate inked in a positive type.

EXAMPLE 122

In a manner analogous to Example 1, SnS was vacuum-evaporated on a grained Al base plate in a deposited amount of 0.3 μg/cm² under a vacuum degree of 5 × 10⁻⁵ Torr, and then a composition of Ge₃₅S₆₀Bi₅ vacuum-evaporated in a deposited amount of 1.8 μg/cm². After exposure for 4 minutes using a 250 W mercury lamp spaced at a distance of 30 cm, the plate was processed with damping water and developing ink as in Example 2 to obtain a lithographic printing plate inked in a positive type.

EXAMPLE 123

In a manner analogous to Example 1, Bi₂S₃ was vacuum-evaporated on a grained Al base plate in a deposited amount of 0.4 μg/cm² under a vacuum degree of 5 × 10⁻⁵ Torr, and then a composition of Ge₃₅S₆₀Bi₅ vacuum-evaporated in a deposited amount of 1.8 μg/cm². After exposure for 4 minutes using a 250 W mercury lamp spaced at a distance of 30 cm, the plate was processed with damping water and developing ink as in Example 2 to obtain a lithographic printing plate inked in a positive type.

EXAMPLE 124

In a manner analogous to Example 1, FeS was vacuum-evaporated on a grained Al base plate in a deposited amount of 0.2 μg/cm² under a vacuum degree of 5 × 10⁻⁵ Torr, and then a composition of Ge₃₅S₆₀Bi₅ vacuum-evaporated in a deposited amount of 1.8 μg/cm². After exposure for 4 minutes using a 250 W mercury lamp spaced at a distance of 30 cm, the plate was processed with damping water and developing ink as in Example 2 to obtain a lithographic printing plate inked in a positive type.

EXAMPLE 125

In a manner analogous to Example 1, CdS was vacuum-evaporated on a grained Al base plate in a deposited amount of 0.2 μg/cm² under a vacuum degree of 5 × 10⁻⁵ Torr, and then a composition of Ge₃₅S₆₀Bi₅ vacuum-evaporated in a deposited amount of 2.4 μg/cm². After exposure for 4 minutes using a 250 W mercury lamp spaced at a distance of 30 cm, the plate was processed with damping water and developing ink as in Example 2 to obtain a lithographic printing plate inked in a positive type.

EXAMPLE 126

In a manner analogous to Example 1, a composition of Ge₃₅S₆₀P₅ was vacuum-evaporated on a grained and anodic oxidation-processed Al base plate in a deposited amount of 2.4 μg/cm² under a vacuum degree of 5 × 10⁻⁵ Torr, and then Ag vacuum-evaporated in a deposited amount of 0.5 μg/cm². After exposure for 10 minutes using Jet Printer 2000, the plate was directly mounted on an A.B. Dick printing press to obtain a lithographic printing plate inked in a positive type. 30,000 impressions were printed without deterioration using this plate. Torn reproduction satisfied the value of 150 lines/inch.

EXAMPLE 127

In a manner analogous to Example 1, a composition of Ge₃₅S₆₀Bi₅ was vacuum-evaporated on a grained Al base plate in a deposited amount of 2.4 μg/cm² under a vacuum degree of 5 × 10⁻⁵ Torr, and then Ag vacuum-evaporated in a deposited amount of 0.3 μg/cm². After exposure for 10 minutes using Jet Printer 2000, the plate was directly mounted on an A.B. Dick printing press to obtain a lithographic printing plate inked in a positive type. 6,000 impressions were printed using this plate.

EXAMPLE 128

In a manner analogous to Example 1, Ag was placed in a tungsten basket evaporation source and vacuum-evaporated on a grained Al base plate in a deposited amount of 0.5 μg/cm² under a vacuum degree of 5 × 10⁻⁵ Torr. Then, a composition of Ge₃₅S₆₀Bi₅ was placed in an alumina-coated tungsten basket evaporation source and vacuum-evaporated in a deposited amount of 2.4 μg/cm². Furthermore, AgI was placed in an alumina-coated tungsten basket evaporation source and vacuum-evaporated in a deposited amount of 0.3 μg/cm². After imagewise exposure for 10 minutes using Jet Printer 2000, the plate was processed with damping water and developing ink as in Example 2 to obtain a lithographic printing plate inked in a positive type.

EXAMPLE 129

In a manner analogous to Example 128, a composition of Ge₃₅S₆₀Bi₅ was vacuum-evaporated on a grained Al base plate, and then Ag vacuum-evaporated in a deposited amount of 0.5 μg/cm² and AgI vacuum-evaporated in a deposited amount of 0.3 μg/cm². After exposure for 9 minutes using Jet Printer 2000, the plate was processed with damping water and developing ink as in Example 2 to obtain a lithographic printing plate inked in a positive type.

EXAMPLE 130

In a manner analogous to Example 128, PbI₂ placed in an alumina-coated tungsten basket evaporation source was vacuum-evaporated on a grained Al base plate in a deposited amount of 0.3 μg/cm², then a composition of Ge₃₅S₆₀Bi₅ vacuum-evaporated in a deposited amount of 2.4 μg/cm² and further AgI vacuum-evaporated in a deposited amount of 0.3 μg/cm². After exposure for 10 minutes using Jet Printer 2000, the plate was processed with damping water and developing ink as in Example 2 to obtain a lithographic printing plate inked in a positive type.

EXAMPLE 131

In a manner analogous to Example 1, a composition of Ge₃₅S₆₀P₅ was vacuum-evaporated on a grained Al base plate thorugh a 500 mesh stainless steel net (optical percent transmission: 28%) intimately superposed thereon (in a deposited amount of 2.4 μg/cm² in a discontinuous state). Then, the stainless steel net was removed, and Ag was vacuum-evaporated thereon in a deposited amount of 0.5 μg/cm² under a vacuum degree of 5 × 10⁻⁵ Torr. After exposure for 10 minutes using Jet Printer 2000, the plate was directly mounted on an A.B. Dick printing press to obtain a lithographic printing plate inked in a positive type.

EXAMPLE 132

In a manner analogous to Example 131, a composition of $Ge_{35}S_{60}P_5$ was vacuum-evaporated on a grained Al base plate through a 500 mesh stainless steel net intimately superposed thereon in a deposited amount of 12.6 $\mu g/cm^2$ in a discontinuous state. Then, the stainless steel net was removed, and Ag was vacuum-evaporated in a deposited amount of 0.5 $\mu g/cm^2$. After exposure for 10 minutes using Jet Printer 2000, the plate was processed with damping water and protective ink as in Example 10, to obtain a lithographic printing plate inked in a positive type. Also, when an anodic oxidation-processed Al base plate was used, a similar lithographic printing plate inked in a positive type was obtained.

EXAMPLE 133

In a manner analogous to Example 1, ZnS was vacuum-evaporated on a grained Al base plate in a deposited amount of 0.2 $\mu g/cm^2$ under a vacuum degree of $5 \times 10^{-5}$ Torr, and then a composition of $Ge_{35}S_{60}Bi_5$ vacuum-evaporated in a deposited amount of 1.8 $\mu g/cm^2$. After exposure for 6 minutes using a 250 W mercury lamp spaced at a distance of 30 cm, the plate was processed with damping water and developing ink as in Example 2 to obtain a lithographic printing plate inked in a positive type.

EXAMPLE 134

In a manner analogous to Example 1, $PbI_2$ was vacuum-evaporated on a grained Al base plate in a deposited amount of 0.3 $\mu g/cm^2$ under a vacuum degree of $5 \times 10^{-5}$ Torr, and then a composition of $Ge_{35}S_{60}Bi_5$ vacuum-evaporated in a deposited amount of 1.8 $\mu g/cm^2$. After exposure for 6 minutes using a 250 W mercury lamp spaced at a distance of 30 cm, the plate was processed with damping water and developing ink as in Example 2 to obtain a lithographic printing plate inked in a positive type.

EXAMPLE 135

In a manner analogous to Example 1, CuI was vacuum-evaporated on a grained Al base plate in a deposited amount of 0.3 $\mu g/cm^2$ under a vacuum degree of $5 \times 10^{-5}$ Torr, then a composition of $Ge_{35}S_{60}Bi_5$ vacuum-evaporated in a deposited amount of 1.8 $\mu g/cm^2$. After exposure for 6 minutes using a 250 W mercury lamp spaced at a distance of 30 cm, the plate was processed with damping water and developing ink as in Example 2 to obtain a lithographic printing plate inked in a positive type.

EXAMPLE 136

In a manner analogous to Example 1, $TeCl_4$ was vacuum-evaporated on a grained Al base plate in a deposited amount of 0.2 $\mu g/cm^2$ under a vacuum degree of $5 \times 10^{-5}$ Torr, then a composition of $Ge_{35}S_{60}Bi_5$ vacuum-evaporated in a deposited amount of 1.8 $\mu g/cm^2$. After exposure for 6 minutes using a 250 W mercury lamp spaced at a distance of 30 cm, the plate was processed with damping water and developing ink as in Example 2 to obtain a lithographic printing plate inked in a positive type.

EXAMPLE 137

In a manner analogous to Example 1, CuCl was vacuum-evaporated on a grained Al base plate in a deposited amount of 0.2 $\mu g/cm^2$ under a vacuum degree of $5 \times 10^{-5}$ Torr, and then a composition of $Ge_{35}S_{60}Bi_5$ vacuum-evaporated in a deposited amount of 1.8 $\mu g/cm^2$. After exposure for 6 minutes using a 250 W mercury lamp spaced at a distance of 30 cm, the plate was processed with damping water and developing ink as in Example 2 to obtain a lithographic printing plate inked in a positive type.

EXAMPLE 138

In a manner analogous to Example 1, AgI was vacuum-evaporated on a grained Al base plate in a deposited amount of 0.3 $\mu g/cm^2$ under a vacuum degree of $5 \times 10^{-5}$ Torr, and then a composition of $Ge_{35}S_{60}Bi_5$ vacuum-evaporated in a deposited amount of 1.8 $\mu g/cm^2$. After exposure for 6 minutes using a 250 W mercury lamp spaced at a distance of 30 cm, the plate was processed with damping water and developing ink as in Example 2 to obtain a lithographic printing plate inked in a positive type.

EXAMPLE 139

In a manner analogous to Example 1, $TiO_2$ was vacuum-evaporated on a grained Al base plate in a deposited amount of 0.2 $\mu g/cm^2$ under a vacuum degree of $5 \times 10^{-5}$ Torr, and then a composition of $Ge_{35}S_{60}Bi_5$ vacuum-evaporated in a deposited amount of 1.8 $\mu g/cm^2$. After exposure for 6 minutes using a 250 W mercury lamp spaced at a distance of 30 cm, the plate was processed with damping water and protective ink as in Example 10 to obtain a lithographic printing plate inked in a positive type.

EXAMPLE 140

In a manner analogous to Example 1, $Bi_2O_3$ was vacuum-evaporated on a grained Al base plate in a deposited amount of 0.4 $\mu g/cm^2$ under a vacuum degree of $5 \times 10^{-5}$ Torr, and then a composition of $Ge_{35}S_{60}Bi_5$ vacuum-evaporated in a deposited amount of 1.8 $\mu g/cm^2$. After exposure for 6 minutes using a 250 W mercury lamp spaced at a distance of 30 cm, the plate was processed with damping water and developing ink as in Example 2 to obtain a lithographic printing plate inked in a positive type.

EXAMPLE 141

In a manner analogous to Example 1, $MoO_3$ was vacuum-evaporated on a grained Al base plate in a deposited amount of 0.2 $\mu g/cm^2$ under a vacuum degree of $5 \times 10^{-5}$ Torr, and then a composition of $Ge_{35}S_{60}Bi_5$ vacuum-evaporated in a deposited amount of 1.8 $\mu g/cm^2$. After exposure for 6 minutes using a 250 W mercury lamp spaced at a distance of 30 cm, the plate was processed with damping water and developing ink as in Example 2 to obtain a lithographic printing plate inked in a positive type.

EXAMPLE 142

In a manner analogous to Example 1, $V_2O_5$ was vacuum-evaporated on a grained Al base plate in a deposited amount of 0.2 $\mu g/cm^2$ under a vacuum degree of $5 \times 10^{-5}$ Torr, and then a composition of $Ge_{35}S_{60}Bi_5$ vacuum-evaporated in a deposited amount of 1.8 $\mu g/cm^2$. After exposure for 6 minutes using a 250 W mercury lamp spaced at a distance of 30 cm, the plate was processed with damping water and developing ink as in Example 2 to obtain a lithographic printing plate inked in a positive type.

EXAMPLE 143

In a manner analogous to Example 1, $Ge_2O_3$ was vacuum-evaporated on a grained Al base plate in a deposited amount of 0.2 $\mu g/cm^2$ under a vacuum degree of 5 × $10^{-5}$ Torr, then a composition of $Ge_{35}S_{60}Bi_5$ vacuum-evaporated in a deposited amount of 1.8 $\mu g/cm^2$. After exposure for 6 minutes using a 250 W mercury lamp spaced at a distance of 30 cm, the plate was processed with damping water and developing ink as in Example 2 to obtain a lithographic printing plate inked in a positive type.

EXAMPLE 144

In a manner analogous to Example 1, $TeO_2$ was vacuum-evaporated on a grained Al base plate in a deposited amount of 0.2 $\mu g/cm^2$ under a vacuum degree of 5 × $10^{-5}$ Torr, and then a composition of $Ge_{35}S_{60}Bi_5$ vacuum-evaporated in a deposited amount of 1.8 $\mu g/cm^2$. After exposure for 6 minutes using a 250 W mercury lamp spaced at a distance of 30 cm, the plate was processed with damping water and developing ink as in Example 2 to obtain a lithographic printing plate inked in a positive type.

EXAMPLE 145

In a manner analogous to Example 1, a composition of $Ge_{34}S_{59}Bi_5Ag_2$ was vacuum-evaporated on a grained Al base plate in a deposited amount of 2.5 $\mu g/cm^2$ under a vacuum degree of 5 × $10^{-5}$ Torr, and then Ag vacuum-evaporated in a deposited amount of 0.5 $\mu g/cm^2$. After exposure for 5 minutes using Jet Printer 2000, the plate was processed with damping water and developing ink as in Example 2 to obtain a lithographic printing plate inked in a positive type.

EXAMPLE 146

In a manner analogous to Example 1, a composition of $Ge_{35}S_{60}Te_5$ was vacuum-evaporated on a grained Al base plate in a deposited amount of 2.5 $\mu g/cm^2$ under a vacuum degree of 5 × $10^{-5}$ Torr, and then Ag vacuum-evaporated in a deposited amount of 0.5 $\mu g/cm^2$. After exposure for 5 minutes using Jet Printer 2000, the plate was processed with damping water and developing ink as in Example 2 to obtain a lithographic printing plate inked in a positive type.

EXAMPLE 147

In a manner analogous to Example 1, a composition of $Ge_{35}S_{60}Al_5$ was vacuum-evaporated on a grained Al base plate in a deposited amount of 2.0 $\mu g/cm^2$ under a vacuum degree of 5 × $10^{-5}$ Torr, and then Ag vacuum-evaporated in a deposited amount of 0.5 $\mu g/cm^2$. After exposure for 5 minutes using Jet Printer 2000, the plate was processed with damping water and developing ink as in Example 2 to obtain a lithographic printing plate inked in a positive type.

EXAMPLE 148

In a manner analogous to Example 1, a composition of $Ge_{35}S_{60}Sb_5$ was vacuum-evaporated on a grained Al base plate in a deposited amount of 2.9 $\mu g/cm^2$ under a vacuum degree of 5 × $10^{-5}$ Torr, and then Ag vacuum-evaporated in a deposited amount of 0.5 $\mu g/cm^2$. After exposure for 5 minutes using Jet Printer 2000, the plate was processed with damping water and developing ink as in Example 2 to obtain a lithographic printing plate inked in a positive type.

EXAMPLE 149

In a manner analogous to Example 1, a composition of $Ge_{35}S_{60}Si_5$ was vacuum-evaporated on a grained Al base plate in a deposited amount of 2.3 $\mu g/cm^2$ under a vacuum degree of 5 × $10^{-5}$ Torr, and then Ag vacuum-evaporated in a deposited amount of 0.5 $\mu g/cm^2$. After exposure for 5 minutes using Jet Printer 2000, the plate was processed with damping water and developing ink as in Example 2 to obtain a lithographic printing plate inked in a positive type.

EXAMPLE 150

In a manner analogous to Example 1, a composition of $Ge_{35}S_{60}Cu_5$ was vacuum-evaporated on a grained Al base plate in a deposited amount of 2.8 $\mu g/cm^2$ under a vacuum degree of 5 × $10^{-5}$ Torr, and then Ag vacuum-evaporated in a deposited amount of 0.5 $\mu g/cm^2$. After exposure for 5 minutes using Jet Printer 2000, the plate was processed with damping water and developing ink as in Example 2 to obtain a lithographic printing plate inked in a positive type.

EXAMPLE 151

In a manner analogous to Example 1, a composition of $Ge_{35}S_{60}Mo_5$ was vacuum-evaporated on a grained Al base plate in a deposited amount of 2.4 $\mu g/cm^2$ under a vacuum degree of 5 × $10^{-5}$ Torr, and then Ag vacuum-evaporated in a deposited amount of 0.5 $\mu g/cm^2$. After exposure for 5 minutes using Jet Printer 2000, the plate was processed with damping water and developing ink as in Example 2 to obtain a lithographic printing plate inked in a positive type.

EXAMPLE 152

In a manner analogous to Example 1, a composition of $Ge_{35}S_{60}W_5$ was vacuum-evaporated on a grained Al base plate in a deposited amount of 2.5 $\mu g/cm^2$ under a vacuum degree of 5 × $10^{-5}$ Torr, and then Ag vacuum-evaporated in a deposited amount of 0.5 $\mu g/cm^2$. After exposure for 5 minutes using Jet Printer 2000, the plate was processed with damping water and developing ink as in Example 2 to obtain a lithographic printing plate inked in a positive type.

EXAMPLE 153

In a manner analogous to Example 1, a composition of $Ge_{35}S_{60}Sn_5$ was vacuum-evaporated on a grained Al base plate in a deposited amount of 2.3 $\mu g/cm^2$ under a vacuum degree of 5 × $10^{-5}$ Torr, and then Ag vacuum-evaporated in a deposited amount of 0.5 $\mu g/cm^2$. After exposure for 5 minutes using Jet Printer 2000, the plate was processed with damping water and developing ink as in Example 2 to obtain a lithographic printing plate inked in a positive type.

EXAMPLE 154

In a manner analogous to Example 1, a composition of $Ge_{35}S_{60}Pb_5$ was vacuum-evaporated on a grained Al base plate in a deposited amount of 2.5 $\mu g/cm^2$ under a vacuum degree of 5 × $10^{-5}$ Torr, and then Ag vacuum-evaporated in a deposited amount of 0.5 $\mu g/cm^2$. After exposure for 5 minutes using Jet Printer 2000, the plate was processed with damping water and developing ink as in Example 2 to obtain a lithographic printing plate inked in a positive type.

EXAMPLE 155

In a manner analogous to Example 1, a composition of $Ge_{35}S_{60}Ta_5$ was vacuum-evaporated on a grained Al base plate in a deposited amount of 2.4 $\mu g/cm^2$ under a vacuum degree of $5 \times 10^{-5}$ Torr, and then Ag vacuum-evaporated in an average thickness of 5.2 Å. After exposure for 5 minutes using Jet Printer 2000, the plate was processed with damping water and developing ink as in Example 2 to obtain a lithographic printing plate inked in a positive type.

EXAMPLE 156

In a manner analogous to Example 1, a composition of $Ge_{35}S_{60}Ni_5$ was vacuum-evaporated on a grained Al base plate in a deposited amount of 2.6 $\mu g/cm^2$ under a vacuum degree of $5 \times 10^{-5}$ Torr, and then Ag vacuum-evaporated in a deposited amount of 0.5 $\mu g/cm^2$. After exposure for 5 minutes using Jet Printer 2000, the plate was processed with damping water and developing ink as in Example 2 to obtain a lithographic printing plate inked in a positive type.

EXAMPLE 157

In a manner analogous to Example 1, a composition of $Ge_{35}S_{60}Co_5$ was vacuum-evaporated on a grained Al base plate in a deposited amount of 2.6 $\mu g/cm^2$ under a vacuum degree of $5 \times 10^{-5}$ Torr, and then Ag vacuum-evaporated in a deposited amount of 0.5 $\mu g/cm^2$. After exposure for 5 minutes using Jet Printer 2000, the plate was processed with damping water and developing ink as in Example 2 to obtain a lithographic printing plate inked in a positive type.

EXAMPLE 158

In a manner analogous to Example 1, a composition of $Ge_{35}S_{60}Mn_5$ was vacuum-evaporated on a grained Al base plate in a deposited amount of 2.5 $\mu g/cm^2$ under a vacuum degree of $5 \times 10^{-5}$ Torr, and then Ag vacuum-evaporated in a deposited amount of 0.5 $\mu g/cm^2$. After exposure for 5 minutes using Jet Printer 2000, the plate was processed with damping water and developing ink as in Example 2 to obtain a lithographic printing plate inked in a positive type.

EXAMPLE 159

In a manner analogous to Example 1, a composition of $Ge_{35}S_{60}Ti_5$ was vacuum-evaporated on a grained Al base plate in a deposited amount of 2.4 $\mu g/cm^2$ under a vacuum degree of $5 \times 10^{-5}$ Torr, and then Ag vacuum-evaporated in a deposited amount of 0.5 $\mu g/cm^2$. After exposure for 5 minutes using Jet Printer 2000, the plate was processed with damping water and developing ink as in Example 2 to obtain a lithographic printing plate inked in a positive type.

EXAMPLE 160

In a manner analogous to Example 1, a composition of $Ge_{35}S_{60}Mg_5$ was vacuum-evaporated on a grained Al base plate in a deposited amount of 2.5 $\mu g/cm^2$ under a vacuum degree of $5 \times 10^{-5}$ Torr, and then Ag vacuum-evaporated in a deposited amount of 0.5 $\mu g/cm^2$. After exposure for 5 minutes using Jet Printer 2000, the plate was processed with damping water and developing ink as in Example 2 to obtain a lithographic printing plate inked in a positive type.

EXAMPLE 161

In a manner analogous to Example 1, a composition of $Ge_{33}S_{57}Bi_5O_5$ was vacuum-evaporated on a grained Al base plate in a deposited amount of 2.3 $\mu g/cm^2$ under a vacuum degree of $4 \times 10^{-5}$ Torr, and then Ag vacuum-evaporated in a deposited amount of 0.6 $\mu g/cm^2$. After exposure for 10 minutes using Jet Printer 2000, the plate was processed with damping water and developing ink as in Example 2 to obtain a lithographic printing plate inked in a positive type.

EXAMPLE 162

In a manner analogous to Example 1, a composition of $Ge_{35}S_{60}C_5$ was vacuum-evaporated on a grained Al base plate in a deposited amount of 2.5 $\mu g/cm^2$ under a vacuum degree of $4 \times 10^{-5}$ Torr, and then Ag vacuum-evaporated in a deposited amount of 0.5 $\mu g/cm^2$. After exposure for 10 minutes using Jet Printer 2000, the plate was processed with damping water and developing ink as in Example 2 to obtain a lithographic printing plate inked in a positive type.

EXAMPLE 163

In a manner analogous to Example 1, a composition of $Ge_{35}S_{60}V_5$ was vacuum-evaporated on a grained Al base plate in a deposited amount of 2.4 $\mu g/cm^2$ under a vacuum degree of $4 \times 10^{-5}$ Torr, and then Ag vacuum-evaporated in a deposited amount of 0.5 $\mu g/cm^2$. After exposure for 10 minutes using Jet Printer 2000, the plate was processed with damping water and developing ink as in Example 2 to obtain a lithographic printing plate inked in a positive type.

EXAMPLE 164

In a manner analogous to Example 1, a composition of $Ge_{35}S_{60}O_5$ was vacuum-evaporated on a grained Al base plate in a deposited amount of 2.4 $\mu g/cm^2$ under a vacuum degree of $4 \times 10^{-5}$ Torr, and then Ag vacuum-evaporated in a deposited amount of 0.6 $\mu g/cm^2$. After exposure for 10 minutes using Jet Printer 2000, the plate was processed with damping water and developing ink as in Example 2 to obtain a lithographic printing plate inked in a positive type.

EXAMPLE 165

In a manner analogous to Example 1, a composition of $Ge_{30}Si_5S_{60}Bi_5$ was vacuum-evaporated on a grained Al base plate in a deposited amount of 2.6 $\mu g/cm^2$ under a vacuum degree of $4 \times 10^{-5}$ Torr, and then Ag vacuum-evaporated in a deposited amount of 0.5 $\mu g/cm^2$. After exposure for 10 minutes using Jet Printer 2000, the plate was directly mounted on an A.B Dick printing press to obtain a lithographic printing plate inked in a positive type.

EXAMPLE 166

In a manner analogous to Example 1, a composition of $Ge_{35}S_{60}P_5$ was discontinuously vacuum-evaporated in a deposited amount of 12 $\mu g/cm^2$ under a vacuum degree of $5 \times 10^{-5}$ Torr on a grained Al base plate through a 500 mesh stainless steel net (optical percent transmission: 28%) intimately superposed thereon, the plate being held in a vacuum trough. Then, after removing the stainless steel net, the net was again placed on the Al base plate, followed by discontinuously vacuum-evaporating Ag in a deposited amount of 1 $\mu g/cm^2$ under a vacuum degree of $5 \times 10^{-5}$ Torr. As a result of observing the resulting sample by using an optical microscope, it was recognized that the composition of germanium and sulfur and silver respectively existed in a discontinuous state containing areas where silver was partly superposed on the composition of germanium and sulfur areas where the composition of germanium and sulfur and silver were continuous to each other and areas where silver and the composition of germanium and sulfur independently existed. After exposure for 10 minutes using Jet Printer 2000, the plate was mounted on an A.B. Dick printing press to obtain a lithographic printing plate inked in a positive type.

While the invention has been described in detail and with reference to specific embodiments thereof, it will be apparent to one skilled in the art that various changes and modifications can be made therein without departing from the spirit and scope thereof.

What is claimed is:

1. A processing-free lithographic printing plate, which comprises a support having deposited thereon a composition containing germanium and sulfur and at least one of a metal or a metal compound other than germanium in a physically mixed state, the term "physically mixed state" meaning the state where both ingredients do not form complete films or layers on said support in a superposed disposition but the microscopic condition in which there are areas where the surface of the support is uncovered, areas of the composition containing germanium and sulfur, areas of a metal or a metal compound, and areas where the composition containing germanium and sulfur and a metal or metal compound are super-imposedly deposited, on the surface of the support.

2. The lithographic printing plate of claim 1, wherein said support is a metal plate, a synthetic resin sheet, a laminate of a metal plate or metal foil and a synthetic resin sheet or paper.

3. The lithographic printing plate of claim 2, wherein said support is an aluminum plate or a zinc plate.

4. The lithographic printing plate of claim 3, wherein said support is an aluminum plate having thereon an anodic oxidation film.

5. The lithographic printing plate of claim 1, wherein said composition containing germanium and sulfur is a Ge-S material, a Ge-S-X material, or Ge-S-X-Y material, wherein each of X and Y is aluminium, magnesium, titanium, vanadium, manganese, cobalt, nickel, molybdenum, tungsten, tin, zinc, lead, copper, silver, palladium, indium, antimony, silicon, bismuth, selenium, arsenic, potassium, tellurium, oxygen, phosphorus or iodine.

6. The lithographic printing plate of claim 5, wherein said composition containing germanium and sulfur is $Ge_{35}S_{65}$, $GeS_2$, $GeS_4$, $Ge_{35}S_{60}Al_5$, $Ge_{35}S_{60}P_5$, $Ge_{35}S_{60}Sb_5$, $Ge_{10}S_{70}Bi_{20}$, $Ge_{35}S_{60}Sn_5$, $Ge_{35}S_{60}Zn_5$, $Ge_{35}S_{60}Pb_5$, $Ge_{25}S_{70}Bi_5$, $Ge_{20}S_{70}Bi_{10}$, $Ge_{20}S_{80}Bi_{10}$, $Ge_{40}S_{60}Bi_1$, $Ge_5S_{80}Bi_{15}$, $Ge_{35}S_{60}Bi_{10}$, $Ge_{35}S_{60}Bi_{15}$, $Ge_{40}S_{60}Bi_5$, $Ge_{40}S_{60}Bi_{10}$, $Ge_{35}S_{60}Bi_2$, $Ge_{38.46}S_{61.54}Bi_5$, $Ge_{37.74}S_{62.26}Bi_5$, $Ge_{31.3}S_{68.7}Bi_5$, $Ge_{10}S_{60}Bi_{30}$, $Ge_{40}S_{60}Bi_{15}$, $Ge_{10}S_{50}Bi_{40}$, $Ge_{35}S_{60}Bi_5$, $Ge_{35}S_{65}Bi_5$, $Ge_{33.3}S_{66.7}Bi_{15}$, $Ge_{20}S_{50}Bi_{30}$, $Ge_{45}S_{50}Bi_5$, $Ge_{20}S_{80}O_{0.2}$, $Ge_{20}S_{80}O_{20}$, $Ge_{42}S_{58}Ag_{0.1}$, $Ge_{42}S_{58}Ag_2$, $Ge_{36}S_{55}I_9$, $Ge_{35}S_{60}Al_{15}$, $Ge_{20}S_{75}Al_5$, $Ge_{30}S_{60}P_{10}$, $Ge_{30}S_{60}Sb_{10}$, $Ge_{25}S_{50}Sb_{25}$, $Ge_{25}Si_{10}S_{60}Bi_5$, $Ge_{30}Si_5S_{60}Bi_5$, $Ge_{20}Si_{15}S_{60}Bi_5$, $Ge_{15}Si_{20}S_{60}Bi_5$, $Ge_{10}Si_{25}S_{60}Bi_5$, $Ge_{33}S_{57}Bi_5Ag_5$, $Ge_{30}S_{60}Bi_5Ag_5$, $Ge_{34}S_{59}Bi_5Ag_2$, $Ge_{33}S_{57}Bi_5O_5$, $Ge_{20}S_{80}P_1O_2$, $Ge_{20}S_{80}P_{10}O_{20}$, $Ge_{20}S_{60}Sb_5P_5$, $Ge_{15}S_{70}Sb_{7.5}P_{7.5}$, $Ge_{10}S_{80}P_{10}Pb_{0.5}$, $Ge_{10}S_{80}P_{10}Pd_5$, $Ge_{10}S_{80}P_{10}Bi_{10}$, $Ge_{35}S_{60}P_5Bi_5$ or $Ge_{35}S_{60}Bi_5I_5$.

7. The lithographic printing plate of claim 1, wherein said metal is copper, silver, gold, aluminum, gallium, indium, tin, vanadium, selenium, chromium, iron, magnesium, germanium, bismuth, manganese, cobalt, nickel, cadmium, thallium, antimony, lead, tellurium, or palladium.

8. The lithographic printing plate of claim 1, wherein said metal compound is a metal halide, a metal sulfide, or a metal oxide.

9. The lithographic printing plate of claim 8, wherein the metal of said metal halide is a metallic element of I(b), IV(b) or VI(b) in the periodic table.

10. The lithographic printing plate of claim 9, wherein said metal is silver, copper or lead.

11. The lithographic printing plate of claim 8, wherein the metal of said metal sulfide is a metallic element of I(b), II(b), IV(b) or V(b) in the periodic table.

12. The lithographic printing plate of claim 11, wherein said metal is silver, copper, lead or iron.

13. The lithographic printing plate of claim 8, wherein the metal of said metal oxide is a metallic element of IV, V or VI in the periodic table.

14. The lithographic printing plate of claim 1, wherein said composition containing germanium and sulfur is present on said support in an amount of about 0.1 $\mu g/cm^2$ to about 12 $\mu g/cm^2$ and said metal or said metal compound is present on said support in an amount of about 0.1 $\mu g/cm^2$ to about 5 $\mu g/cm^2$.

15. The lithographic printing plate of claim 1, wherein said composition containing germanium and sulfur and at least one of said metal or said metal compound each is deposited in an isle-like pattern.

16. The lithographic printing plate of claim 1, obtained either by first vacuum-depositing said metal or said metal compound and then vacuum-depositing said composition, or by vacuum-depositing said metal or said metal compound after first vacuum-depositing said composition.

17. A processing-free lithographic printing plate, which comprises a support having deposited thereon a composition containing germanium and sulfur and at least one of a metal or a metal compound in a physically mixed state, the term "physically mixed state" meaning the state where both ingredients do not form complete films or layers on said support in a superposed disposition but the microscopic condition in which there are areas where the surface of the support is uncovered, areas of the composition containing germanium and sulfur, areas of a metal or a metal compound, and areas where the composition containing germanium and sulfur and a metal or metal compound are superimposedly deposited on the surface of the support, said metal compound being a metal halide selected from the group consisting of $PbI_2$, $CuCl$, $CuI$, $HgI$, $TeCl_4$ and $AgI$, a metal sulfide selected from the group consisting of $Ag_2S$, $PbS$, $SnS$, $BiS$, $FeS$, $Fe_2S_3$, $CdS$ and $ZnS$ or a metal oxide selected from the group consisting of $V_2O_5$, $MoO_3$, $Ge_2O_3$, $Bi_2O_3$, $TiO_2$, $PbO$ and $TeO_2$.

18. A processing-free lithographic printing plate, which comprises a support having deposited thereon a composition containing germanium and sulfur and at least one of a metal or a metal compound other than germanium in a physically mixed state, the term "physically mixed state" meaning the state where both ingredients do not form complete films or layers on said support in a superposed disposition but the microscopic condition in which there are areas where the surface of the support is uncovered, areas of the composition containing germanium and sulfur, areas of a metal or a metal compound, and areas where the composition containing germanium and sulfur and a metal or metal compound are super-imposedly deposited, on the surface of the support, the physically mixed stated having been formed by applying said composition and said metal or metal compound through masks and/or screens.

* * * * *